United States Patent [19]
Hayashide et al.

[11] Patent Number: 5,488,246
[45] Date of Patent: Jan. 30, 1996

[54] SEMICONDUCTOR DEVICE AND METHOD OF MANUFACTURING THE SAME

[75] Inventors: Yoshio Hayashide; Kouichirou Tsujita, both of Hyogo, Japan

[73] Assignee: Mitsubishi Denki Kabushiki Kaisha, Tokyo, Japan

[21] Appl. No.: 229,273

[22] Filed: Apr. 18, 1994

[62] Division of Ser. No. 101,383, Jul. 19, 1993, Pat. No. 5,413,001.

[30] Foreign Application Priority Data

Apr. 16, 1993 [JP] Japan .................................... 5-089770
Apr. 8, 1994 [JP] Japan .................................... 6-070467

[51] Int. Cl.⁶ .................................................. H01L 27/12
[52] U.S. Cl. ........................ 257/336; 257/437; 257/640; 257/649
[58] Field of Search .................................... 257/336, 437, 257/640, 649

[56] References Cited

U.S. PATENT DOCUMENTS 5,177,581  1/1993  Kubo et al. .......................... 257/437
5,331,191  7/1994  Sugiura et al. ........................ 257/336

OTHER PUBLICATIONS

Solid State Technology in Japanese, Jan. 1992 p. 17.

Extended Abstracts of the 1993 International Conference on Solid State Devices and Materials, Makuhari, 1993, pp. 570–572, Aug. 1993.

SPIE vol. 1674 Optical/Laser Microlithography V (Mar. 1991), pp. 350–361.

*Primary Examiner*—Edward Wojciechowicz
*Attorney, Agent, or Firm*—Lowe, Price, LeBlanc & Becker

[57] ABSTRACT

A semiconductor device and method of manufacturing the same includes the steps of forming silicon nitride films including much silicon than a stoichiometric silicon nitride ($Si_3N_4$) and which will be an anti-reflection film, forming a resist film on the plasma silicon nitride films and, and concurrently patterning plasma silicon nitride films and conductive layers and using the resist film as a mask. As a result, high integration of the semiconductor device can be attained.

6 Claims, 30 Drawing Sheets

5  4  3  8  2     6  1  8

5  4  3  8  2  7  6  1  8

THICKNESS OF SILICON OXIDE FILM(nm)

SEMICONDUCTOR DEVICE AND METHOD OF MANUFACTURING THE SAME

This application contains subject matter closely related to the subject matter of now abandoned application number 08/043,698, filed on Apr. 8, 1993, and a divisional application thereof filed Oct. 19, 1994.

BACKGROUND OF THE INVENTION

1. Field of the Invention

The present invention relates generally to a method of manufacturing a semiconductor device and more particularly to a method of manufacturing an antireflection film used in photolithography.

2. Description of the Background Art

Hereinafter, the structure of a conventional semiconductor device will be described with reference to FIG. 31.

An active region 100 enclosed by an isolation oxide film 2 is formed on a semiconductor substrate 1.

A gate electrode 51 is formed in the active region 100 of the semiconductor substrate 1, with a gate oxide film 3 therebetween. Gate electrode 51 includes a first polycrystalline silicon film 4 and a first refractory metal silicide film 5.

Gate electrode 51 has its top portion covered with a silicon oxide film 6 and its side portion covered with a sidewall insulation film 7.

Impurity diffusion layers 8, 8 constituting source/drain regions are formed at the main surface of semiconductor substrate 1, with gate electrode 51 therebetween.

According to the above structure, an MOS type field effect transistor 50 is formed.

On one of the impurity diffusion layers 8, a first interconnection layer 52 including a second polycrystalline silicon layer 10 and a second refractory metal silicide layer 11 is formed.

On the other one of the impurity diffusion layers 8, a second interconnection layer 16 of aluminum layer is formed through a contact hole 15 provided in silicon oxide films 9 and 13 and a BPSG (Boro Phospho Silicate Glass) film 14.

A third interconnection layer 19 of aluminum is connected to second interconnection layer 16 through a contact hole 18 provided in a silicon oxide film 17.

Additionally, the entire surface of semiconductor substrate 1 is covered with a passivation film 20.

Manufacturing steps of the semiconductor device having the above structure will be described with reference to FIGS. 32–43

First, referring to FIG. 32, an oxide film 30 of $SiO_2$ is formed to the thickness of 5 to 30 nm by the CVD method on semiconductor substrate 1. Thereafter, on oxide film 30, a polysilicon film 31 is formed to the thickness of 20 nm to 100 nm by the CVD method. Thereafter, on polysilicon film 31, a silicon nitride film 32 of $Si_3N_4$ which is stoichiometrical silicon nitride, is formed to the thickness of 50 nm–400 nm.

Thereafter, referring to FIG. 33, a resist film 33 having a prescribed pattern is formed on silicon nitride film 32. Thereafter, silicon nitride film 32 and polysilicon film 31 are patterned using resist film 33 as a mask.

Then, referring to FIG. 34, resist film 33 is removed, and thereafter, a field oxide film 2 having the thickness of 200 nm to 600 nm is formed on the surface of semiconductor substrate 1 by thermal oxidation at a temperature in the range of from 600° C. to 1300° C.

Then, referring to FIG. 35, silicon nitride film 32, polysilicon film 31 and oxide film 30 are removed, and thereafter, a gate oxide film 3 having the thickness of 5 to 30 nm is formed on the surface of semiconductor substrate 1 by thermal oxidation.

Referring to FIG. 36, a first polycrystalline silicon film 4 doped with phosphorus or arsenic is formed to the thickness of 50–200 nm by vapor deposition method. A first refractory metal silicide layer 5 of tungsten silicide or the like is formed to the thickness of 50–300 mm by sputtering or the like.

A silicon oxide film 6 is formed on first refractory metal silicide film 5 by using vapor deposition method. A resist film 21 having a prescribed pattern is formed on the silicon oxide film 6 by photolithography.

Referring to FIG. 37, silicon oxide film 6 is processed using resist film 21 as a mask by reactive ion-etching method (hereinafter, referred to as RIE method) using carbon tetrafluoride or the like.

Referring to FIG. 38, after removing resist film 21, first refractory metal silicide film 5 and first polycrystalline silicon film 4 are patterned using silicon oxide film 6 as a mask by RIE method using chlorine or the like.

Then impurity such as phosphorus or boron is introduced to the surface of semiconductor substrate 1 using first refractory metal silicide film 5 and first polycrystalline silicon film 4 as a mask by ion implantation method to form impurity diffusion layers 8, 8.

Thereafter, a silicon oxide film having the thickness of about 50 to about 200 nm is deposited on the entire surface of semiconductor substrate 1. Then, the silicon oxide film is etched by anisotropic etching so as to form, on sidewalls of the first refractory metal silicide film 5 and the first polycrystalline silicon film 4, a sidewall insulating film 7, as shown in FIG. 39.

Then, using sidewall insulation film 7 as a mask, additional impurity ions are implanted to the surface of semiconductor substrate 1 to complete impurity diffusion layers 8, 8.

A silicon oxide film 9 is deposited on the entire surface of semiconductor substrate 1 by vapor deposition method. Then, a contact hole 12 shown in FIG. 40 is formed above one of the impurity diffusion layers 8 of silicon oxide film 9 by photolithography and RIE method.

Referring to FIG. 41, a second polycrystalline silicon film 10 of 50–200 nm in thickness including phosphorus or arsenic is deposited on the entire surface of semiconductor substrate 1 by vapor deposition method. A second refractory metal silicide film 11 of tungsten silicide or the like is formed on second polycrystalline silicon film 10 by sputtering or the like.

Referring to FIG. 42, second polycrystalline silicon film 10 and second refractory metal silicide film 11 are patterned into a prescribed shape by using photolithography and RIE method.

Referring to FIG. 43, silicon oxide film 13 is deposited on the entire surface of semiconductor substrate 1 by vapor deposition method. Then a BPSG film 14 is deposited on the silicon oxide film 13 by vapor deposition method. Then BPSG film 14 is heated at the temperature of approximately 850° C. to complete an interlayer insulation film 14 having a relatively flat surface as shown in FIG. 43.

Referring to FIG. 44, a contact hole 15 reaching the other one of the impurity diffusion layers 8 is formed by using photolithography and RIE method.

Referring to FIG. 45, a second interconnection layer 16 of aluminum-silicon alloy or the like is formed on the entire surface of semiconductor substrate 1 by sputtering.

Referring to FIG. 46, a silicon oxide film 17 is deposited on the entire surface of semiconductor substrate 1 by using plasma enhanced vapor deposition method or the like.

Referring to FIG. 47, a contact hole 18 reaching to second interconnection layer 16 is formed at a prescribed position of silicon oxide film 17 by using photolithography or the like. Then a third interconnection layer 19 of aluminum-silicon alloy or the like is deposited and formed into a prescribed shape by using photolithography or the like.

Then a passivation film 20 of silicon oxide or the like is formed on the entire surface of semiconductor substrate 1 by using plasma enhanced vapor deposition method and the semiconductor device shown in FIG. 31 is completed.

In the semiconductor device having the above structure, it is necessary to arrange thinner wirings in higher density to improve the degree of integration.

Thus, to improve the degree of integration and to attain high density by using thinner wirings, it is necessary to carry out exposure with a light of shorter wavelength in photolithography. Recently, i-line having wavelength of 365 nm, KrF excimer laser having wavelength of 248 nm or the like is used as a light source.

However, when the wavelength of the exposure light is shortened as in the case of i-line or krF excimer laser beam, the reflectance of the interface between the silicon film or the refractory metal silicide film, and the resist film increases, causing a deformation of the resist pattern by the exposure light reflected transversely in the stepped portion of refractory metal silicide layer 5 having high reflectance as shown in FIG. 48, for example. To avoid this, the reflectance of the exposure light at the surface of the lower layer of the resist film is desired to be approximately 30% or less.

According to the structure shown in FIG. 48, the resist film is influenced by multi-reflection of exposure light in a transparent silicon oxide film 6. As a result, the reflectance at the interface between the resist film and the silicon oxide film 6 changes in the stepped portion or the like, preventing the patterning of the resist film to a desired shape.

Referring to FIG. 49, the relation between the thickness of the silicon oxide film provided on a tungsten silicide film and the reflectance at the interface between the silicon oxide film and the resist film, with the wavelength of the exposure light being 248 nm will be described, for example.

The absolute value of the reflectance of the silicon oxide film is, independent of its thickness, 35% or more and the reflectance varies up to approximately 50% according to the change in thickness of the silicon oxide film.

Thus, the thickness of the silicon oxide film changes in the stepped portion, and hence reflectance of the exposure light at the interface between the silicon oxide and the resist film changes, causing variation of pattern dimension of the resist film.

To avoid this, method of providing an anti-reflection film on the top surface of the resist film or between the resist film and a layer to be etched is known.

As described in Solid State Technology in Japanese, Jan. 1992 pp. 17, for example, there is a method of providing, as an anti-reflection film, titanium nitride, polymer or the like under a photoresist.

The anti-reflection film using such material has good optical characteristics, good shading and effectively reduces the reflection of exposure light. As a result, desired shape of the resist pattern can be obtained.

However, when titanium nitride or polymer is used as the above anti-reflection film, the following problems occur.

At first, a titanium compound such as titanium nitride is generally turned into vapor with low pressure. Therefore, it is difficult to obtain the titanium compound which has the same shape as the resist pattern by RIE method.

When an organic material such as polymer is used as an anti-reflection film, the material has the same characteristics as the resist film, and therefore it causes deformation of pattern of resist film during etching of the anti-reflection film.

The material such as the titanium compound or polymer described above sometimes has characteristics in etching different from the layer to be etched which is formed thereunder. Therefore, it is necessary to use a different etching apparatus than that for the layer to be etched in order to process the anti-reflection film.

Thus, the material of the conventional anti-reflection film causes increase of the number of steps for manufacturing semiconductor device, thereby increasing the cost of the semiconductor device.

Additionally, since it is difficult to process the anti-reflection film accurately, it is practically impossible to use an exposure light having a short wavelength in photolithography using the conventional anti-reflection film.

As a result, there is a limit in the high integration of a semiconductor device, causing difficulty in providing a semiconductor device with high integration at low price.

In the process for manufacturing the semiconductor device described above, the following problem has been encountered in the step of forming field oxide film 2 (FIGS. 32 to 34).

First, referring to FIG. 50, a gate electrode 51 of a MOS field effect transistor 50 is formed at a prescribed position of an active region 100 surrounded by an isolating oxide film 2. Generally, the width L of gate electrode 51 is referred to as the channel length (L), while the length of gate electrode 51 which corresponds to the width of the active region W is referred to as the channel width (W). The channel length (L) and channel width (W) are important factors defining the performance of MOS field effect transistor 50, and generally, it is desired that a plurality of MOS field effect transistors formed on the same semiconductor well all have the same channel length (L) and channel width (W) so that all the MOS field effect transistors have the same performance.

However, channel width (W) depends on the width (W) of active region 100, and the width (W) of active region 100 depends on the precision in manufacturing the field oxide film 2. Accordingly, performance of the MOS field effect transistors may be made uniform, if field oxide film 2 is formed with high precision.

However, the dimensional precision of the field oxide film 2 cannot be improved from the following reasons.

In the step of forming the field oxide film shown in FIGS. 32 to 34, there is provided a silicon nitride film 32 of $Si_3N_4$, which is a stoichiometrical silicon nitride formed by thermal CVD, which is an optically transparent film. Therefore, in the step of patterning the resist film by lithography shown in FIG. 33, there is generated multiple reflection of the exposure light in silicon nitride film 32. As a result, the energy of exposure light with which resist film 33 is irradiated changes dependent on the change of thickness of nitride film 33, so that desired pattern of resist film 33 cannot be formed.

For example, if the thickness of oxide film 30 is fixed at 15 nm, the thickness of polysilicon film 31 is fixed at 50 nm and the thickness of resist film 33 is fixed at 1000 nm and the thickness of silicon nitride film 32 is changed from 160 nm to 240 nm, the reflectance of exposure light at the surface of resist film 33 changes from 2% to 23%, as shown in FIG. 51. As a result, the energy of exposure light with which resist film 33 is irradiated is changed.

Further, when the thickness of the resist film 33 is changed from 700 nm to 800 nm under the same conditions as mentioned above, the reflectance of the exposure light at the interface between resist film 33 and the silicon nitride film varies as wide as from 2% to 36% as shown in FIG. 52, because of multiple reflection in the resist film. At this time, the thickness of the resist film formed on the semiconductor wafer on which a plurality if semiconductor devices are to be formed, which is desired to be uniform ideally, comes to have the error of about ±100 nm actually. As a result, the energy of the exposure light with which the resist film 33 is irradiated differs from portion to portion in the semiconductor wafer.

SUMMARY OF THE INVENTION

One object of the invention is to provide a semiconductor device and method of manufacturing the same having an antireflection film which enables the high integration of the semiconductor device.

Another object is to provide a semiconductor device and method of manufacturing the same having an anti-reflection film which can be etched by the same etching apparatus as that for other layers.

A still further object of the present invention is to provide a semiconductor device and method of manufacturing the same device in which an element isolating region is formed with precision, allowing manufacturing of semiconductor devices having uniform performance.

According to one aspect of the present invention the method of manufacturing the semiconductor device includes, in order to attain the above objects, the following steps.

At first, a conductive layer is formed above a semiconductor substrate. Then, a plasma silicon nitride film including more silicon than the stoichiometrical silicon nitride ($Si_3N_4$) which will be an anti-reflection film is formed on the conductive layer by plasma-enhanced vapor deposition method.

Then, a resist film including a prescribed pattern is formed on the plasma silicon nitride film by photolithography. Then, using the resist film as a mask, the plasma silicon nitride film and the conductive layer are patterned at the same time.

According to the method of manufacturing the semiconductor device, plasma silicon nitride film is formed as an anti-reflection film, and the plasma silicon nitride film and the conductive layer are patterned at the same time. Thus, the plasma silicon nitride film and the conductive layer can be patterned successively by the same apparatus. As a result, the number of manufacturing steps of the semiconductor device can be reduced.

In a preferred embodiment of the method of manufacturing the semiconductor device of the present invention, the step of forming the above conductive layer includes the step of forming a polycrystalline silicon film and the step of forming a refractory metal silicide film.

Thus, the conductive layer and the plasma silicon nitride film come to have the same characteristics in etching. Therefore, the plasma silicon nitride film and the conductive layer can be patterned easily and successively by the same apparatus.

As a result, the number of manufacturing steps of the semiconductor device can be reduced.

More preferably, in the step of forming the plasma silicon nitride film, flow rate of ammonia is not more than that of monosilane in the atmosphere of material gas including monosilane, nitrogen and ammonia in the plasma vapor deposition method, so that real part and imaginary part of complex refractive index of the plasma silicon nitride film with respect to the exposure light used in the photolithography are in the range of 1.8–3.4 and 0.5–2.0, respectively.

Thus, the reflectance of the plasma silicon nitride film with respect to the exposure light is held to 30% or less.

Therefore, the resist film on the anti-reflection film can be patterned accurately by photolithography, enabling the use of an exposure light of short wavelength. As a result, high integration of the semiconductor device can be attained.

More preferably, parameters (x, Y) of plasma silicon nitride film ($Si_xN_y$) are set to be $0.75 < x/y < 1.4$. By doing so, the reflectance of the plasma silicon nitride film with respect to the wavelength of the exposure light can be suppressed to at most 30%. This enables highly precise patterning of the resist film on the anti-reflection film during photolithography, and therefore shorter wavelength of the exposure light can be used.

According to another aspect of the present invention, the method of manufacturing the semiconductor device includes, in order to attain the above object, the following steps.

A conductive layer is formed above a semiconductor substrate. Then, an insulation film is formed on the conductive layer.

Then a plasma silicon nitride film including more silicon than a stoichiometrical silicon nitride ($Si_3N_4$) to be an anti-reflection film is formed on the insulation film by plasma enhanced vapor deposition method. Then, a resist film including a prescribed pattern is formed on the plasma silicon nitride film by using photolithography.

Then, using the resist film as a mask, the plasma silicon nitride film and the insulation film are patterned. Then, after the removable of the resist film, the conductive layer are patterned using the plasma silicon nitride film and the insulation film as a mask, and concurrently the plasma silicon nitride film is removed.

Thus, without providing the step of removing the plasma silicon nitride film, the plasma silicon nitride film can be removed efficiently.

Therefore, the number of manufacturing steps of the semiconductor device is not increased. As a result, the cost of manufacturing the semiconductor device can be reduced.

More preferably, the step of forming the conductive layer includes the step of forming a polycrystalline silicon film and the step of forming a refractory metal silicide film, and the step of forming the insulation film includes the step of forming a silicon oxide film.

Thus, the conductive layer and the plasma silicon nitride film come to have the same characteristics in etching.

Therefore, the plasma silicon nitride film and the conductive layer can be patterned easily and successively by the same apparatus.

As a result, the number of the manufacturing steps of the semiconductor device can be reduced.

Still more preferably, in the steps of forming the conductive layer and of forming the plasma silicon nitride film, the relation between the ratio ($T_1/T_2$) wherein $T_1$ indicates the thickness of the plasma silicon nitride film and $T_2$ indicates the thickness of the conductive layer, and the ratio ($V_1/V_2$) wherein $V_1$ indicates the etching rate of the plasma silicon nitride film and $V_2$ indicates the etching rate of the conductive layer when an etchant used in the patterning of the conductive layer is used is as follows:

$$T_1/T_2 \leq V_1/V_2.$$

Thus, at the end of etching of the conductive layer, removal of plasma silicon nitride film is completed at the same time, or the film has been already removed by that time.

Therefore, the plasma silicon nitride film can be removed efficiently in the etching period of the conductive layer.

As a result, manufacturing of the semiconductor device can be carried out efficiently.

The method of manufacturing semiconductor devices of the present invention in accordance with a still further aspect includes the following steps.

First, a plasma silicon nitride film including much silicon than a stoichiometrical silicon nitride ($Si_3N_4$) is formed on a semiconductor substrate by plasma vapor deposition, which film serves as an anti-oxidation film. Thereafter, on the plasma silicon nitride film, a photoresist film is formed.

Then, on the photoresist film, a resist pattern having an opening is formed by photolithography. Then, the plasma silicon nitride film is patterned by using the photoresist film having the resist pattern thus formed.

Thereafter, on a main surface of the semiconductor substrate on which the opening formed in the plasma silicon nitride film is located, a field oxide film is formed by thermal oxidation.

The step of forming the plasma silicon nitride film includes the step of forming a plasma silicon nitride film in which real part of complex index of refraction with respect to the wavelength of the exposure light employed in photolithography is at least 1.8 and at most 3.4 and the imaginary part of the complex index of refraction is at least 0.5 and at most 2.0.

Accordingly, variation of the energy of the exposure light to the resist film caused by multiple reflection of the exposure light generated in the resist film during patterning of the plasma silicon nitride film and variation of the energy of exposure light to the resist film caused by variation of the thickness of the resist film can be suppressed.

Therefore, the resist film can be patterned as desired, and the plasma silicon nitride film can be patterned with precision by using the resist film. As a result, the plasma silicon nitride film can be patterned with precision, and the field oxide film can be formed on a desired region. This makes functions of semiconductor devices uniform.

Preferably, there is provided a step of forming a silicon nitride film of a stoichiometrical silicon nitride ($Si_3N_4$) between the semiconductor substrate and the plasma silicon nitride film. Accordingly, as compared with an example which includes the silicon nitride film only, the stress generated during growth of the field oxide film can be absorbed by the silicon nitride film, which contributes to suppression of the growth of bird's beaks during the formation of the field oxide film.

More preferably, the thickness of the plasma silicon nitride film is in the range of 7.5 nm to 11 nm, and the thickness of the silicon nitride film is in the range of 176 nm to 189 nm. Accordingly, variation of reflectance of the exposure light at the surface of the resist film can be significantly suppressed. As a result, the resist film can be patterned with high precision, which enables provision of the field oxide film of a desired shape.

In order to attain the above described objects, the semiconductor device in accordance with the present invention includes a semiconductor substrate on which an element isolating region and an active region are formed, a MOS field effect transistor formed on the active region and having a pair of impurity diffused layers, a conductive layer connected electrically to one of the pair of impurity diffused layers, a first anti-reflection film formed of a plasma silicon nitride film including more silicon than a stoichiometrical silicon nitride ($Si_3N_4$) formed on the conductive layer, an interlayer insulating film having a contact hole reaching the other one of the impurity diffused layers and covering the first anti-reflection film and the MOS field effect transistor, a second anti-reflection film of plasma silicon nitride film including more silicon than the stoichiometrical silicon nitride ($Si_3N_4$) formed on the interlayer insulating film, and an interconnection layer formed on the second anti-reflection film and electrically connected to the other one of the pair of impurity diffused layers.

In the semiconductor device, first and second anti-reflection films formed of plasma silicon nitride films including more silicon than the stoichiometrical silicon nitride ($Si_3N_4$) are formed on the semiconductor layer and the interlayer insulating film. Consequently, the conductive layer and the interlayer insulating film can be patterned precisely. As a result, a highly reliable semiconductor device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments based on the present invention will be described in the following with reference to the figures.

At first, referring to FIG. 1, a cross sectional structure of a semiconductor device formed according to the embodiment will be described.

Figure 1:
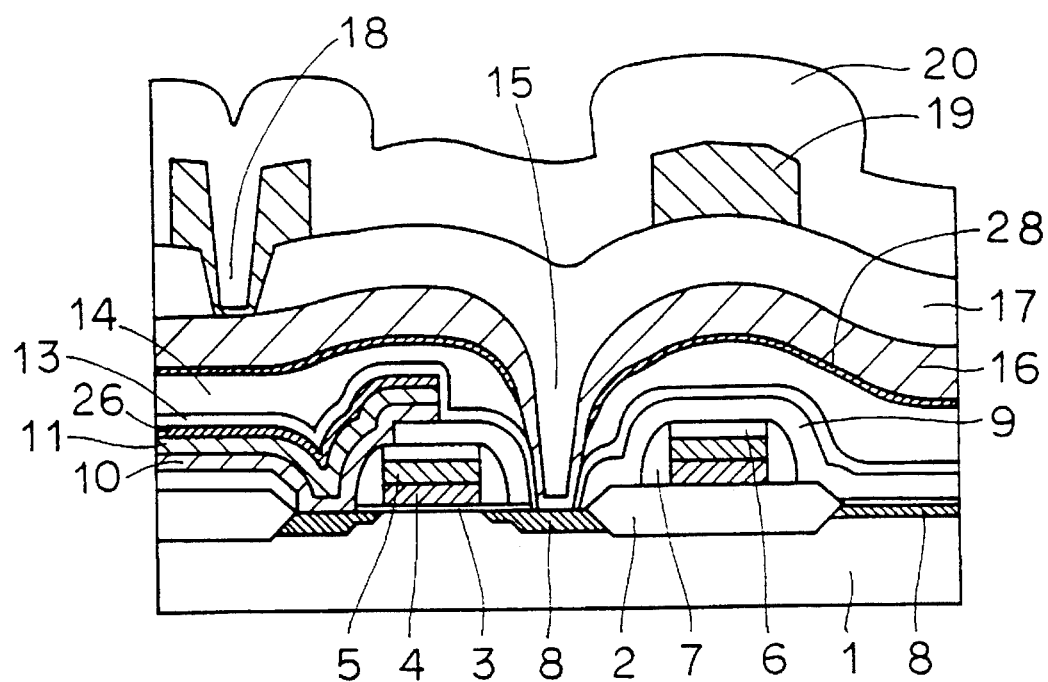
FIG. 1 is a cross sectional view showing the structure of a semiconductor device based on the present invention.
Figure 31:
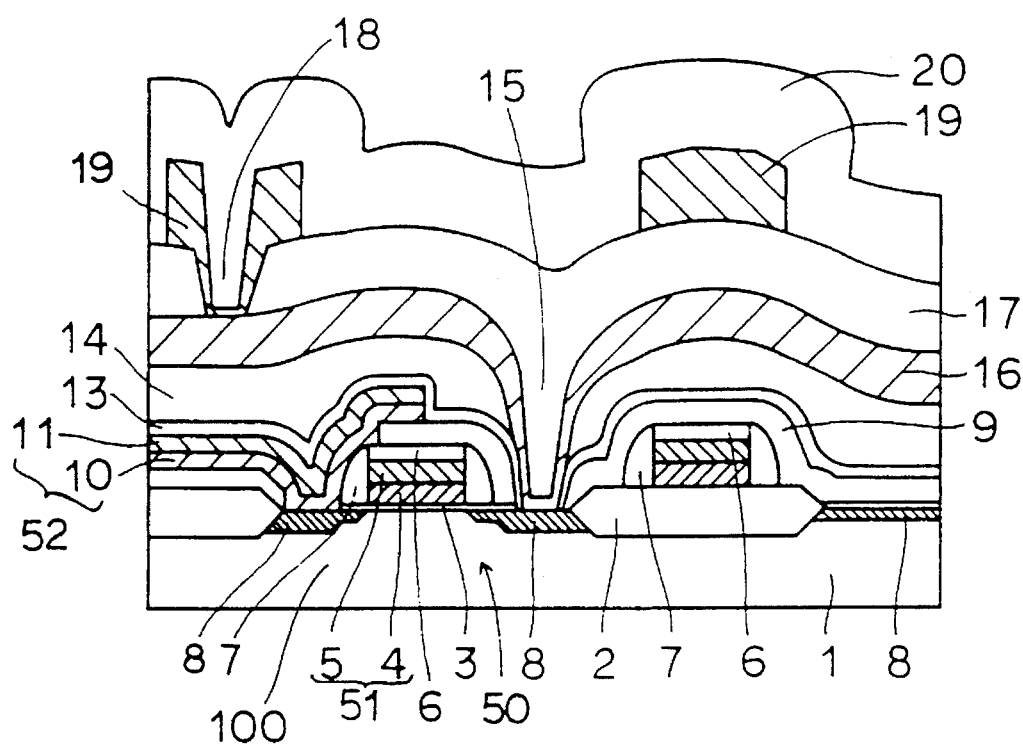
FIG. 31 is a cross sectional view showing a structure of a conventional semiconductor device.

The semiconductor device shown in FIG. 1 is different from that shown in FIG. 31 in that anti-reflection films 26 and 28 of a plasma silicon nitride film including more silicon than the stoichiometrical silicon nitride ($Si_3N_4$) are left on a second refractory metal silicide film 11 and on an interlayer oxide film 14.

Except this point, the semiconductor device shown in FIG. 1 is identical to the conventional semiconductor device shown in FIG. 31. Therefore, the description thereof will not be repeated.

The method of manufacturing the semiconductor device shown in FIG. 1 will be described with reference to FIGS. 2 to 4, 7 to 11 and 13 to 19.

Figure 2:
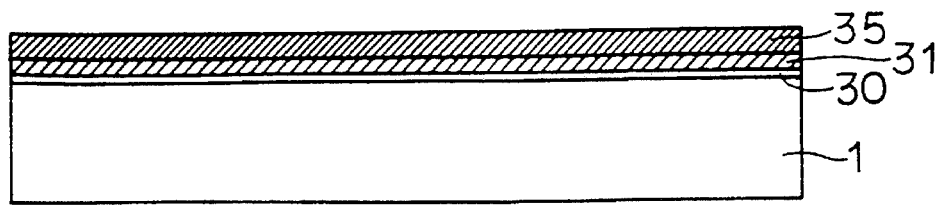
FIGS. 2 through 4 are cross sectional views showing the first to third manufacturing steps of the first embodiment based on the present invention.

Referring to FIG. 2, an oxide film 30 of $SiO_2$ is formed on a semiconductor substrate 1 to the thickness of 5 to 30 nm by the CVD method. Thereafter, on $SiO_2$ film 30, a polysilicon film 31 is formed to the thickness of 20 to 100 nm by the CVD method. Thereafter, on polysilicon film 31, a plasma silicon nitride film including much silicon than the stoichiometrical silicon nitride ($Si_3N_4$) is formed to the thickness of 160 nm to 240 nm by plasma enhanced vapor deposition. Here, the plasma silicon nitride film 35 is formed relatively thick to have the thickness of 160 nm to 240 nm, in order to suppress generation of the bird's beaks of the field oxide film, which will be formed subsequently.

The method of forming a plasma silicon nitride film including much silicon than the stoichiometric silicon nitride ($Si_3N_4$) will be described in detail. In the method of forming the plasma silicon nitride film, a film including mixture of Si, N and H atoms is formed by exciting plasma in an atmosphere including monosilane gas, ammonia gas and nitrogen gas. Therefore, the molecular formula of the mixture film is given by $Si_xN_y$:H, where x and y are numerals and the value of x/y changes from ¾ to ∞. H atoms are bonded to dangling Si atoms. When x/y=¾, $Si_3N_4$ results, which is the same as an ordinary stoichiometric nitride film. When x/y=∞, only Si results, which is an amorphous silicon.

The plasma silicon nitride film in accordance with the present embodiment provides a plasma silicon nitride film including much silicon than a stoichiometric nitride film ($Si_3N_4$) by changing the ratio of flow rates of monosilane gas providing Si atoms, and ammonia gas and $N_2$ providing N atoms. As a result, the complex refractive index of the plasma silicon nitride film of this embodiment (n-ixk;i is an imaginary number) can assume any value from that of a stoichiometric nitride film ($2.27-0xi$) to that of amorphous silicon ($1.9-3.4xi$). The reference character n represents a real number indicative of the so called refractive index defining the light velocity in the substance, while k represents an imaginary number which corresponds to an absorption coefficient of light.

In these embodiments, the flow rate of monosilane gas, ammonia gas and nitrogen gas are set to 150 sccm, 50 sccm and 1000 sccm, respectively, the temperature for formation is set to about 400° C., the pressure for information is set 4 Torr, and the high frequency power is set to 240 W. The complex refractive index of the plasma silicon nitride film formed under such conditions with respect to the exposure light having the wavelength of 248 nm has a real number n of 2.2 and the imaginary number k of 1.0.

When the plasma silicon nitride film is formed using monosilane gas, ammonia gas, and nitrogen gas as a materials by a parallel plate type plasma enhanced vapor deposition apparatus, complex refractive index (wherein real part is n and imaginary part is k) is obtained as a function of the applied high frequency power, and when the high frequency power is not more than 600 W, a complex refractive index can be obtained which allows the use of the plasma silicon nitride film 35 as an anti-reflection film.

Figure 5:
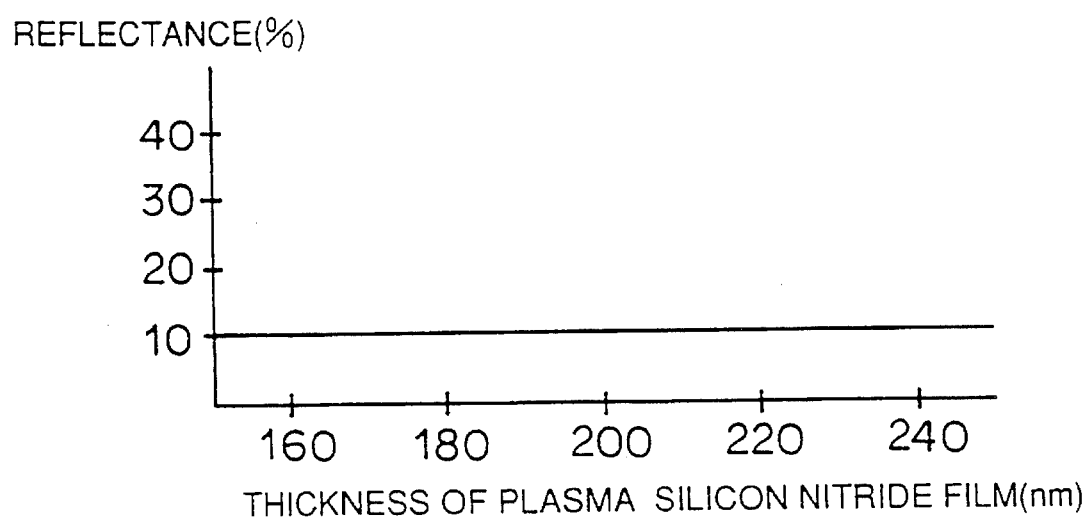
FIG. 5 shows reflectance of exposure light at the interface between the resist film and the plasma silicon nitride film with respect to variation in thickness of the plasma silicon nitride film in accordance with a first embodiment of the present invention.

FIG. 5 shows reflectance at the interface between resist film 33 and the plasma nitride film 35 with the thickness of plasma silicon nitride film 35 formed under the above described conditions changed from 160 nm to 240 nm while the thicknesses of oxide film 30, polysilicon film 31 and resist film 33 are fixed at 15 nm, 50 nm and 1000 nm, respectively, at the exposure wavelength of 248 nm. As can be seen from FIG. 5, even if the thickness of plasma silicon nitride film 35 varies, the reflectance of exposure light at resist film 33 is constantly about 10%, and it does not vary. Therefore, provided that the thickness of resist film 33 is constant, the reflectance of the exposure light at the interface between plasma silicon nitride film 35 and resist film 33 is kept constant, even if the thickness of plasma silicon nitride film 35 varies.

Figure 6:
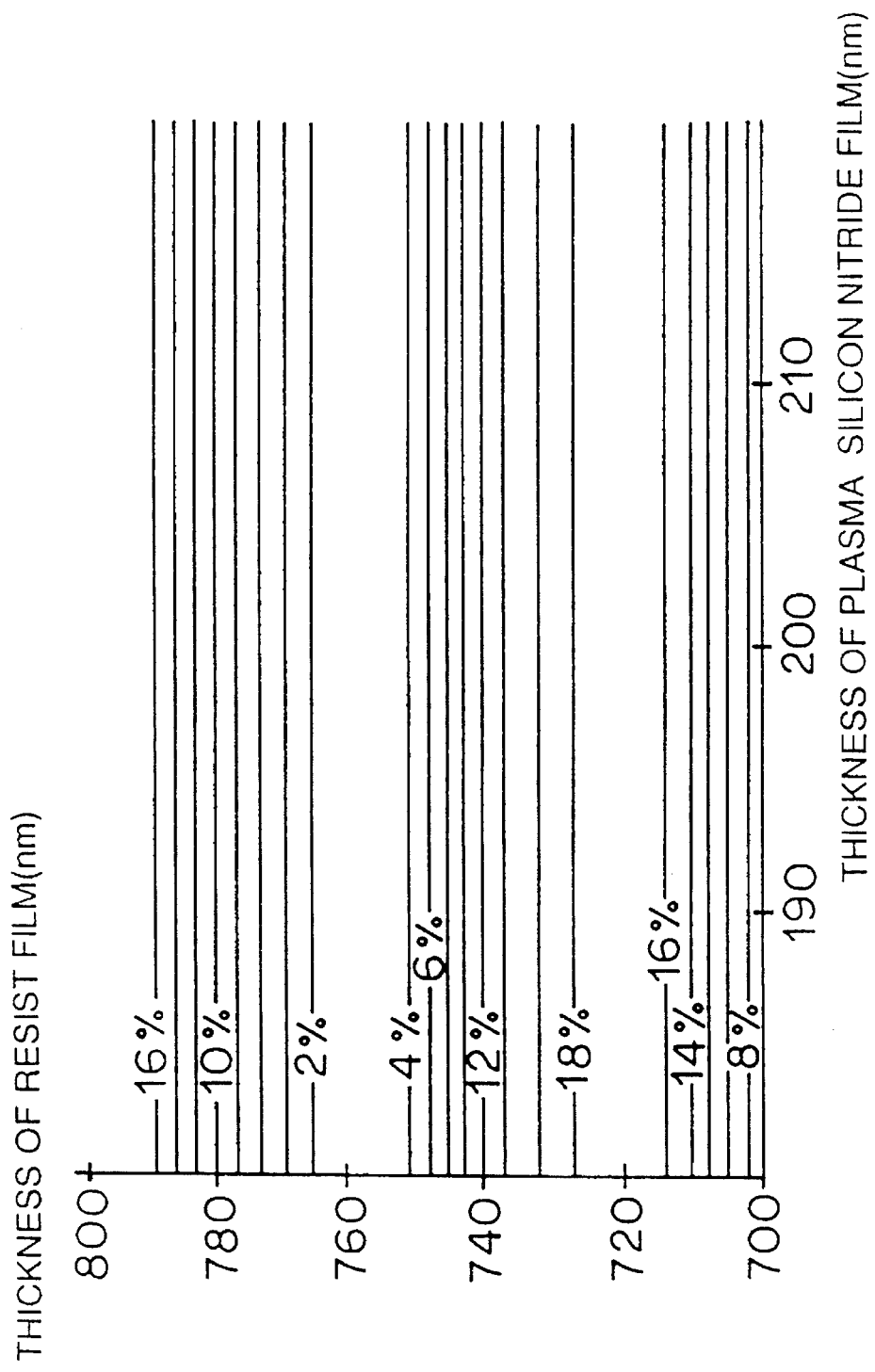
FIG. 6 shows reflectance of exposure light at the interface between the resist film and the plasma silicon nitride film with respect to variation in thickness of the resist film and the plasma silicon nitride film in accordance with the first embodiment of the present invention.

FIG. 6 shows the reflectance at the interface between resist film 33 and plasma nitride film 35 under the same conditions as above, except that the thickness of resist film 33 itself is simultaneously changed in the range of from 70 nm to 800 nm. As can be seen from FIG. 6, the reflectance of the exposure light varies as the thickness of the resist film 33 changes. However, the range of variation is from 2% to 18%, and the reflectance can be reduced to one half as compared with the prior art. Therefore, by using plasma silicon nitride film 35 described above, variation of optical energy of the exposure light to the resist film, derived from the change in thickness of the resist film, can be suppressed. As a result, the resist film 33 can be patterned to a desired shape with high precision.

Figure 3:
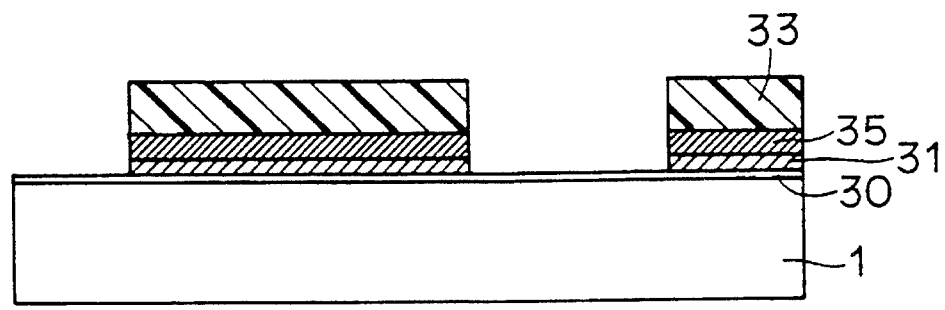

Then, referring to FIG. 3, plasma silicon nitride film 35 and polysilicon film 31 are patterned using resist film 33 formed in the above described manner as a mask. Thereafter, referring to FIG. 4, resist film 33 is removed, and a field oxide film 2 having the thickness of 200 nm to 600 nm is formed by thermal oxidation at a temperature in the range from 600° C. to 1300° C.

Figure 7:
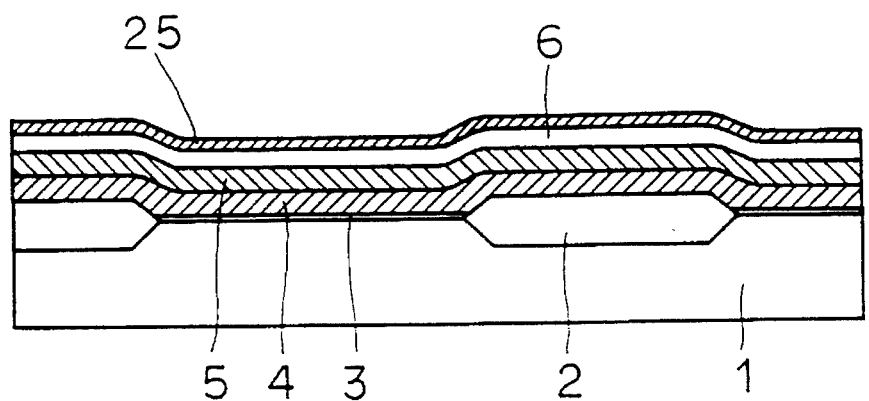
FIGS. 7 to 10 are cross sections showing the fourth to seventh steps of manufacturing in accordance with the first embodiment of the present invention.

Then, referring to FIG. 7, plasma silicon nitride film 35, polysilicon film 31 and oxide 30 are removed, and a gate insulation film 3 having the thickness of 5 to 30 nm is formed on the surface of semiconductor substrate 1 by thermal oxidation. Then, a first polycrystalline silicon film 4 doped with phosphorus or arsenic is formed by vapor deposition to the thickness of 50 to 200 nm. Thereafter, a first metal silicide film 5 of high melting point such as tungsten silicide is formed by, for example, sputtering, to the thickness of 50 to 300 nm.

Thereafter, on the first metal silicide film 5 having high melting point, a silicon oxide film 6 is formed by vapor deposition, to the thickness of 50 to 300 nm. Thereafter, on silicon oxide film 6, a plasma silicon nitride film 25 including much silicon than the stoichiometric silicon nitride ($Si_3N_4$) having the thickness of about 20 nm is formed by plasma enhanced vapor deposition.

The plasma silicon nitride film 25 is formed by the plasma enhanced vapor deposition method under the condition that the flow rates of monosilane gas, ammonia gas and nitrogen gas are 150 sccm, 50 sccm, 1000 sccm, respectively, the formation temperature is 400° C., the formation pressure is 4 Torr, and high frequency applied power is 240 W. Thus, real part (n) and imaginary part (k) of the complex refractive index of the plasma silicon nitride film 25 with respect to the exposure light having the wavelength of 248 nm come to be 2.2 and 1.0, respectively.

The reflectance of the plasma silicon nitride film 25 with respect to the exposure light is approximately 10%.

Assume that a silicon oxide film of 200 nm in thickness is formed on tungsten silicide film, for example, and on the silicon oxide film, a plasma silicon nitride film of 20 nm in thickness is provided. The relation between the reflectance at interface between the anti-reflection film and the resist film and complex refractive index of the plasma silicon nitride film, with the wavelengths of the exposure light being 248 nm and 365 nm are shown in FIGS. 23 and 24, respectively.

Figure 23:
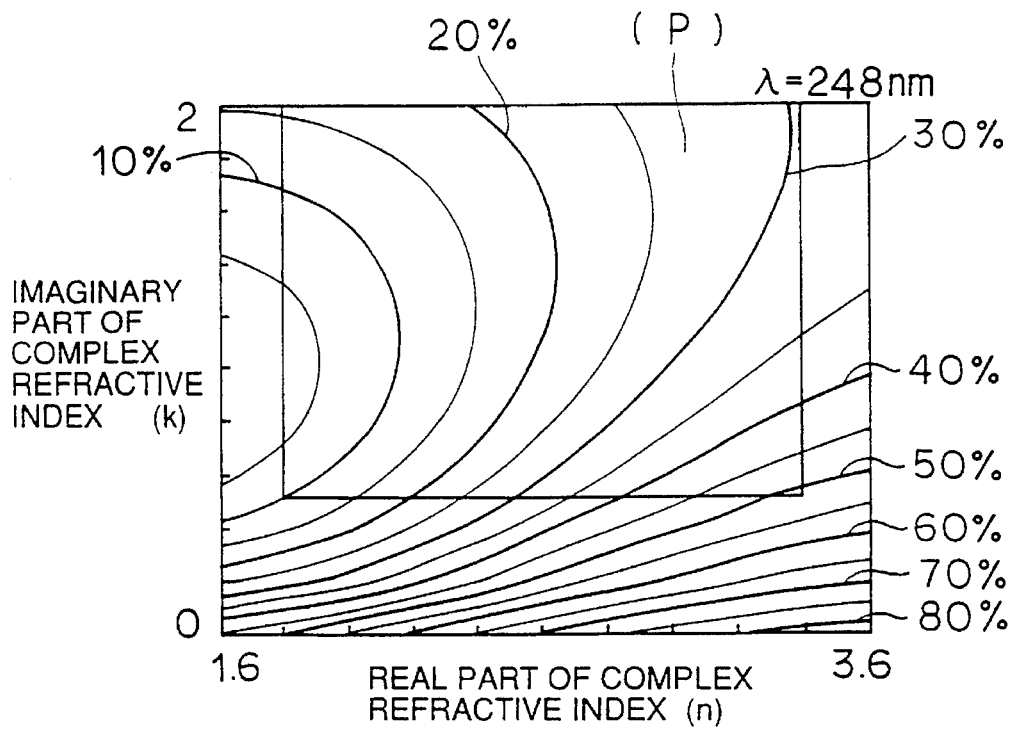
FIG. 23 is a graph showing the relation between the refractive index of the plasma silicon nitride film and the reflectance at the interface between the plasma silicon nitride film and the resist film with respect to the light having the wavelength of 248 nm.
Figure 24:
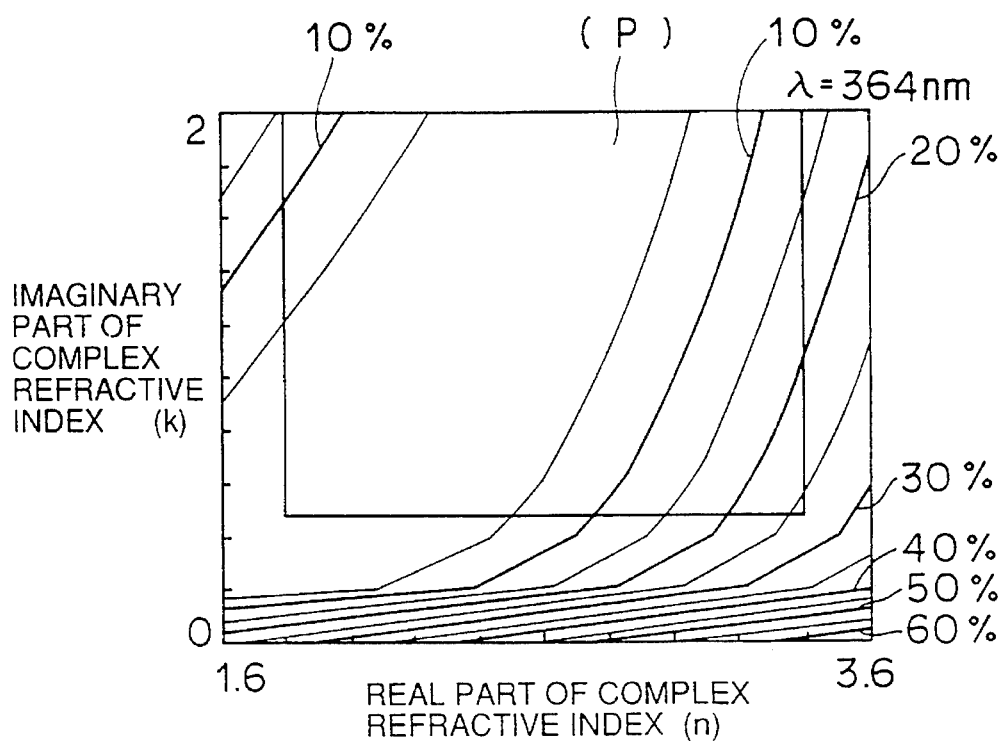
FIG. 24 is a graph showing the relation between the refractive index of the plasma silicon nitride film and the reflectance of the interface between the plasma silicon nitride film and the resist film, with respect to the light having the wavelength of 365 nm.

Referring to FIGS. 23 and 24, as for the relation between real part and imaginary part of complex refractive index of the plasma silicon nitride film to realize the reflectance of 30% or less, it is found that the real part should be in the range of 1.8–3.4 and the imaginary part should be in the range of 0.5–2.0, respectively (region 34).

Figure 8:
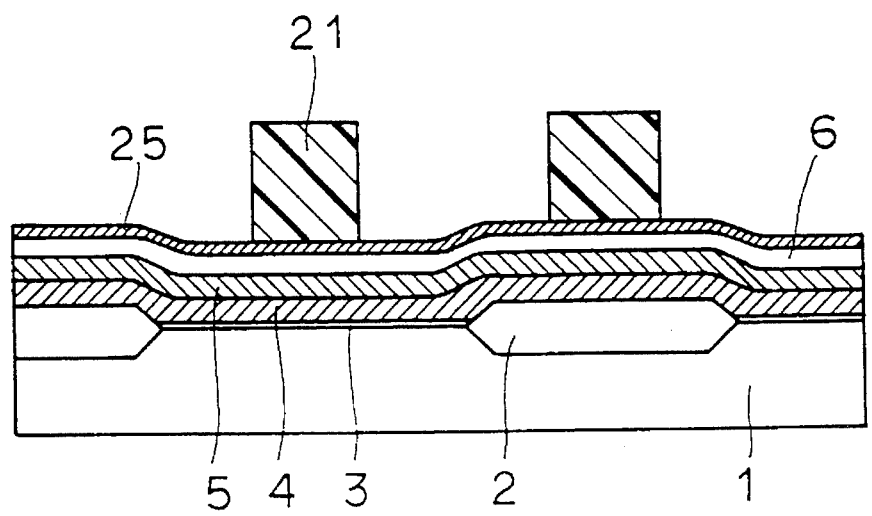

Referring to FIG. 8, a prescribed pattern of resist film 21 is formed by applying the resist film of 700 nm 1000 nm on the plasma silicon nitride film 25 by photolithography.

Figure 9:
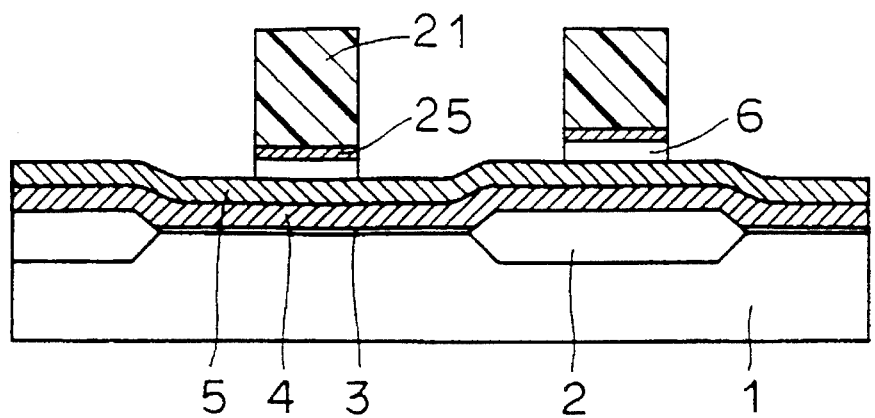

Referring to FIG. 9, using the resist film 21 as a mask, silicon nitride film 25 and silicon oxide film 6 are successively etched by RIE method using carbon tetrafluoride or the like to provide prescribed patterns.

Figure 10:
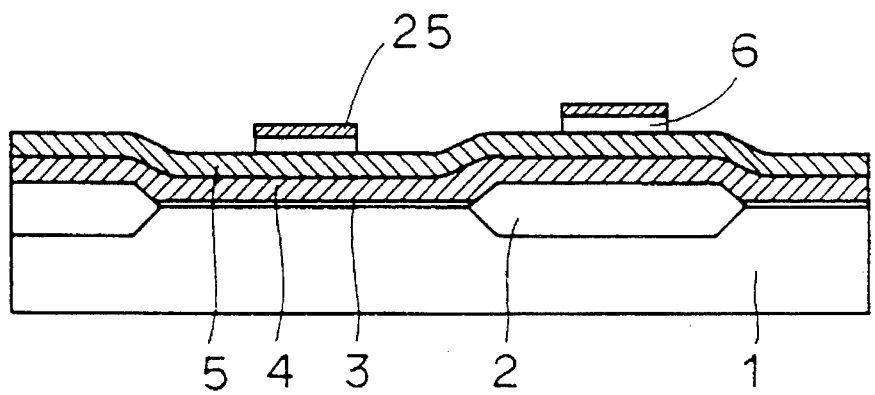

Referring to FIG. 10, resist film 21 is removed. Then, referring to FIG. 11(a), using plasma silicon nitride film 25 and silicon oxide film 6 as a mask, a first polycrystalline silicon film 4 and a first refractory metal silicide film 5 are formed by RIE method using chlorine or the like.

Figure 11A:
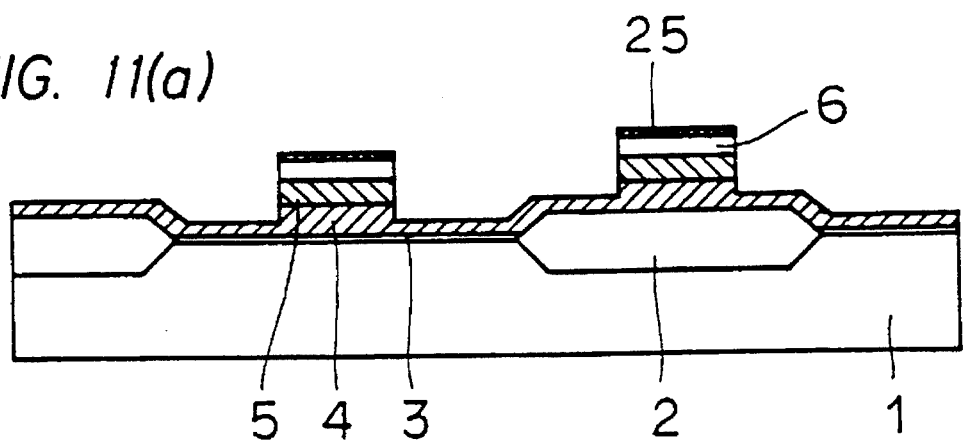
FIG. 11 includes cross sections (a) and (b) showing the eighth step of manufacturing in accordance with the first embodiment of the present invention.
Figure 11B:
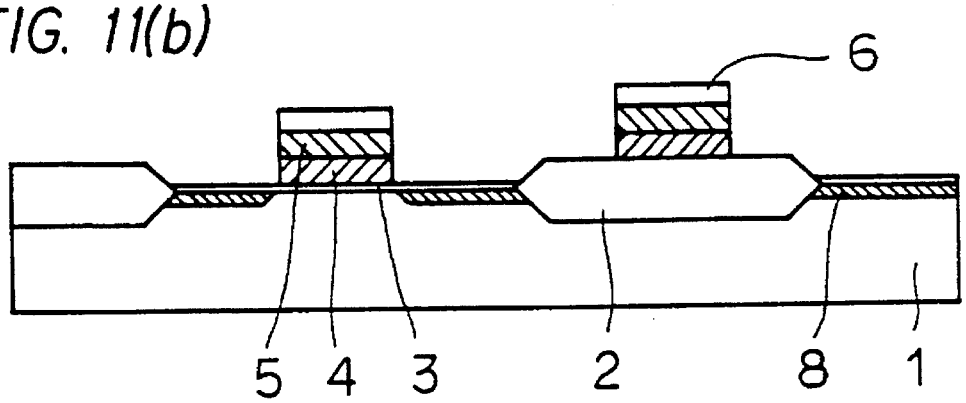

FIG. 11(a) shows an intermediate state of first polycrystalline silicon film 4 and first refractory metal silicide film 5 being etched. FIG. 11(b) shows a state at the end of etching of the first polycrystalline silicon layer 4 and the first refractory metal silicide layer 5. The conditions for RIE are as follows. Namely, ECR (Electron Cyclotron Resonance) RIE method is employed, etching gas includes $Cl_2/O_2$=50/10 (sccm), the pressure is 0.7 mTorr, microwave power is 140 W, and high frequency power is 60 W.

The anti-reflection film of plasma silicon nitride film 25 has an approximately the same etching rate as that of the silicon oxide film when processed by RIE method. In contrast, the anti-reflection film has selectivity of approximately 3–10 with respect to tungsten silicide or polycrystalline silicon.

Thus, the plasma silicon nitride film can be processed easily by RIE method using etching gas such as carbon tetrafluoride used in the fabrication of silicon oxide film or chlorine used in the process of the polycrystalline silicon, and process dimension can be better controlled as compared with the materials such as titanium nitride or polymer used conventionally.

By using a silicon film or silicon oxide film as an underlayer of the plasma silicon nitride film as shown above, the anti-reflection film can be formed successively by the same apparatus in etching.

Conditions and composition ratio of the plasma silicon nitride film and conditions for etching will be described.

Figure 12:
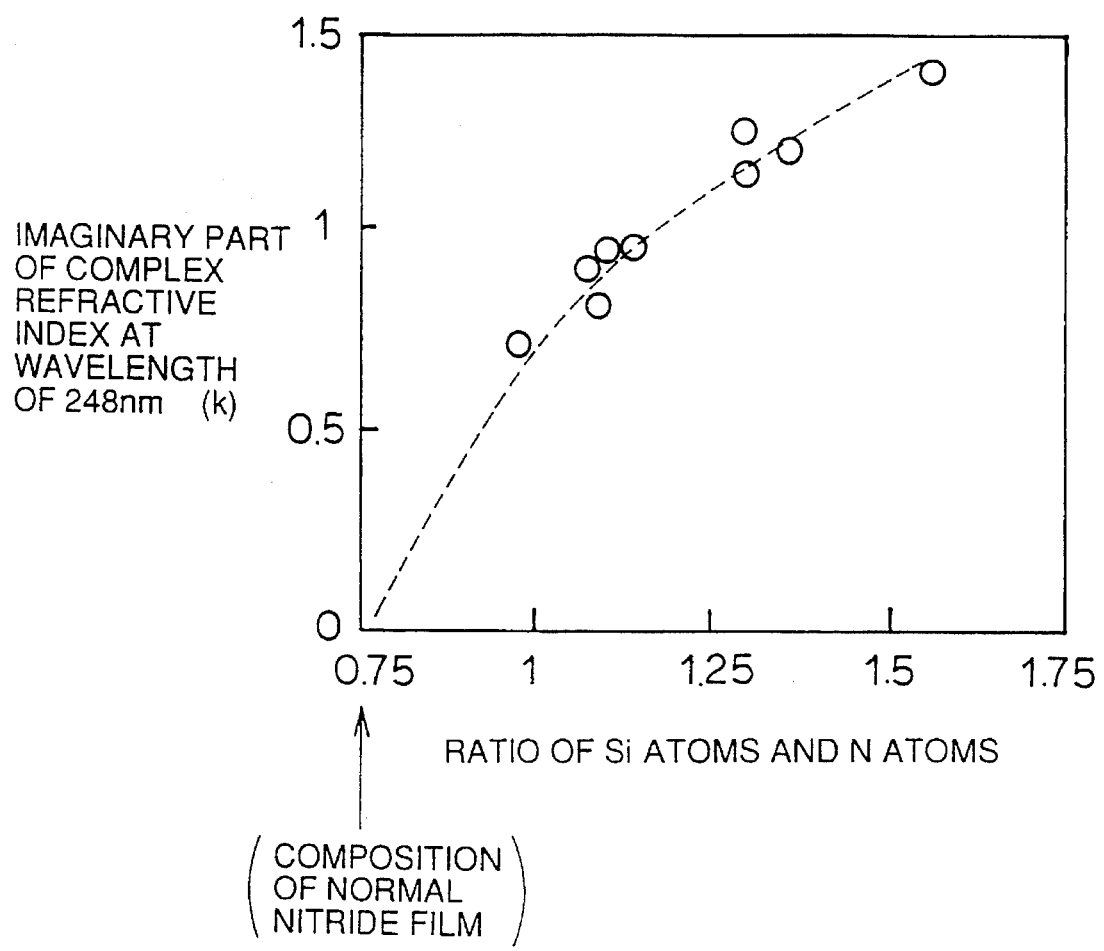
FIG. 12 is a graph showing relation between the ratio of Si atoms and nitrogen atoms in the plasma silicon nitride film and the imaginary part of the complex index of refraction in the first embodiment of the present invention.

The relation between the ratio of silicon and nitride in the silicon nitride film and composition of the imaginary part (k) of the complex index of refraction is shown in FIG. 12. The silicon nitride film provided by thermal CVD generally used in the prior art has the composition of $Si_3N_4$ based on the numerical relation between chemical composition and physical properties of silicon and nitride, and the ratio is Si/N=0.75. In the case of the nitride film in accordance with the present invention, the ratio is Si/N≧0.09 if the value K is k ≧0.05, when KrF excimer laser having the exposure wavelength of 248 nm is used. The larger the imaginary part (k), the larger the ratio Si/N. As the anti reflection effect of the silicon nitride film is improved, the silicon component increases.

Meanwhile, during etching of the first refractory metal silicide layer, by setting conditions to facilitate etching of silicon component, the first refractory metal silicide layer can be etched. Similarly, the etching rate increases as the silicon component increases in the plasma silicon nitride film.

The silicon nitride film formed of a stoichiometric silicon nitride ($Si_3N_4$) has such etching characteristics that is close to that of the oxide film. Meanwhile, the plasma silicon nitride film having the imaginably part (k) of the complex refractive index of k>0.5 so as to improve effect as an anti reflection film comes to have an intermediate etching characteristic between that of oxide film and that of polysilicon. Accordingly, it becomes possible to simultaneously process the plasma silicon nitride film including much silicon than the stoichiometric silicon nitride ($Si_3N_4$) provided on the first metal silicide of high melting point by the etchant for the first metal silicide having high melting point, or to simultaneously eliminate the anti reflection film left on the oxide film while the first high melting point metal silicide is processed.

When we represent the ratio of the thickness of plasma silicon nitride film 25 ($T_1$) to the thickness of a first interconnection layer including first polycrystalline silicon film 4 and second refractory metal silicide film 5 ($T_2$) as ($T_1/T_2$), the relation between the ratio ($V_1/V_2$) of the etching rate of plasma silicon nitride film 25 ($V_1$) and the etching rate of a first interconnection layer ($V_2$) when chlorine is used as an etchant is desired to be $$T_1/T_2 \leq V_1/V_2.$$

If the thickness which satisfies the relation is attained, at the end of etching of first polycrystalline silicon film 4 and first refractory metal silicide film 5, removal of plasma silicon nitride film 25 can be completed at the same time, or the film 25 may have been already removed by that time (see FIG. 11(b)).

According to the present embodiment, the thickness of first polycrystalline silicon film 4 is 100 nm and the thickness of first refractory metal silicide film is 100 nm. The thickness of the plasma silicon nitride film is 20 nm and therefore $T_1/T_2=0.1$.

According to the present embodiment, $V_1/V_2$ is about 0.25, which sufficiently satisfies the above relation of the expression and according to the relation realized in the present embodiment, the plasma silicon nitride film can be removed simultaneously with the interconnection layer even though the thickness of plasma silicon nitride film is not more than 50 nm.

Figure 13:
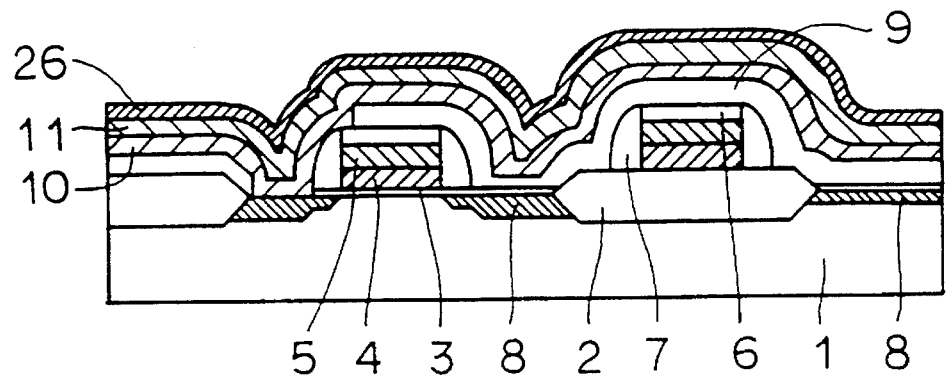
FIGS. 13 to 19 are cross sections showing the ninth to fifteenth steps of manufacturing in accordance with the first embodiment of the present invention.

Referring to FIG. 13, a sidewall insulation film 7, an impurity diffusion layer 8, a second polycrystalline silicon film 10, and a second refractory metal silicide film 11 are formed by the process which is the same as that of the conventional one shown in FIGS. 34–37.

Note that second polycrystalline silicon film 10 and second refractory metal silicide film 11 are formed under the same condition as first polycrystalline silicon film 4 and first refractory metal silicide film 5.

On second refractory metal silicide film 11, silicon nitride film 26 is formed under the same condition as the above anti-reflection film 25 of the plasma silicon nitride film.

Figure 14:
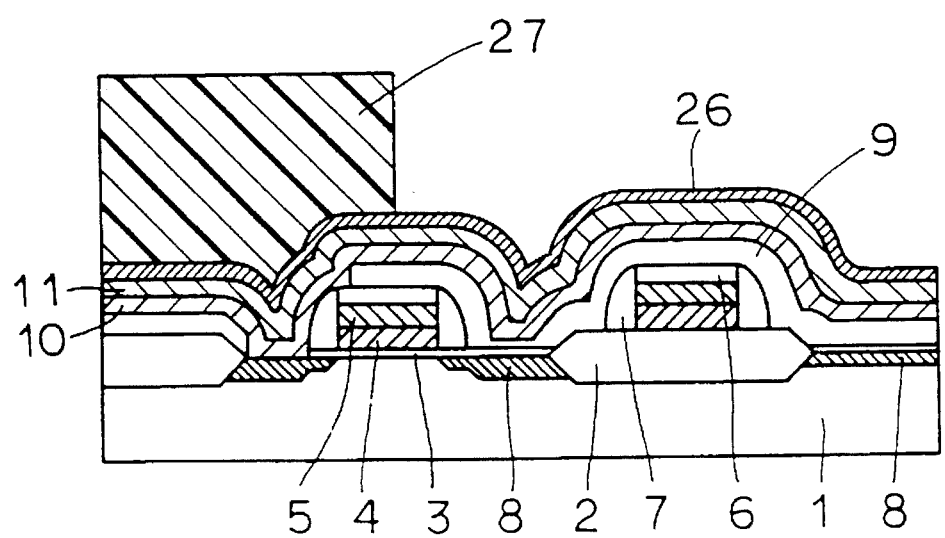

Referring to FIG. 14, a resist film 27 having a prescribed pattern is formed at a prescribed position of semiconductor substrate 1.

Figure 15:
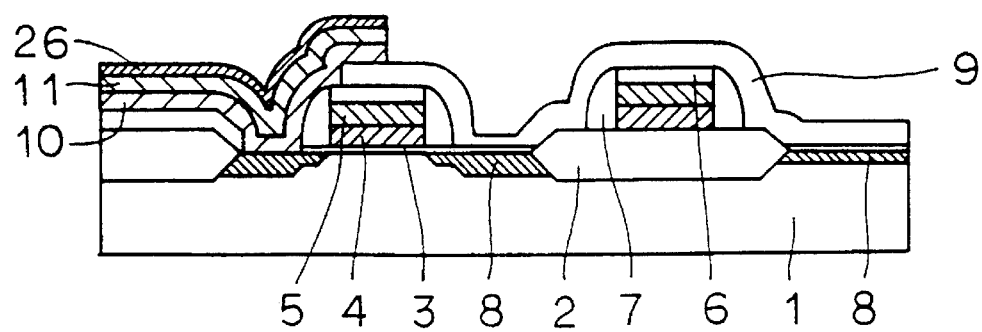

Referring to FIG. 15, using resist film 27 as a mask, plasma silicon nitride film 26 is etched by RIE method or the like. Then, second refractory metal silicide film 11 and second polycrystalline silicon film 10 are etched.

The ratio between the etch rate $V_1$ of plasma silicon nitride film 26 and etch rate $V_2$ of a second interconnection layer including second refractory metal silicide film 11 and second polycrystalline silicon film 11 with respect to the same etchant is about $V_1/V_2=0.25$ as mentioned above. Therefore, compared with the etching time when plasma silicon nitride film 26 is not used, the plasma silicon nitride film 26, second refractory metal silicide film 11 and second polysilicon film 10 can be continuously processed by the same apparatus in an etching period of 1.4 times.

Figure 16:
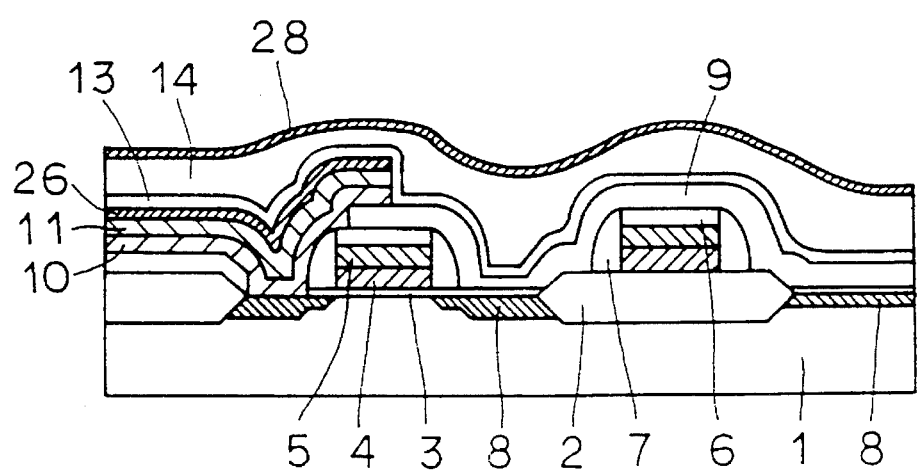

Referring to FIG. 16, silicon oxide film 13 is deposited at the entire surface of semiconductor substrate 1. Then, BPSG film 14 is formed and heated so as to provide an interlayer insulation film 14 having relatively flat surface.

At the surface of interlayer insulation film 14, a plasma silicon nitride film 28 is formed as an anti-reflection film by the same method as plasma silicon nitride film 25 or 26 described above.

Figure 17:
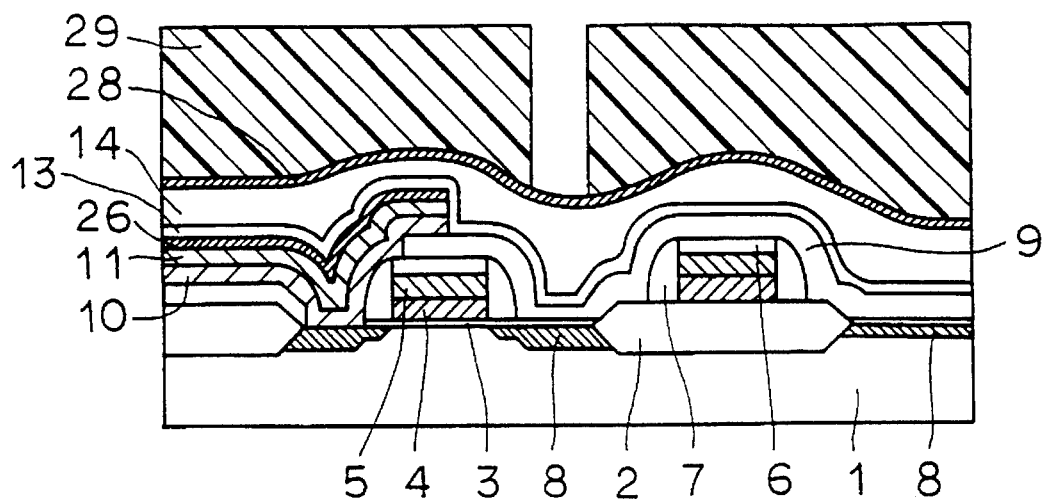

Referring to FIG. 17, on plasma silicon nitride film 28 a resist film 29 of a prescribed pattern is formed.

Figure 18:
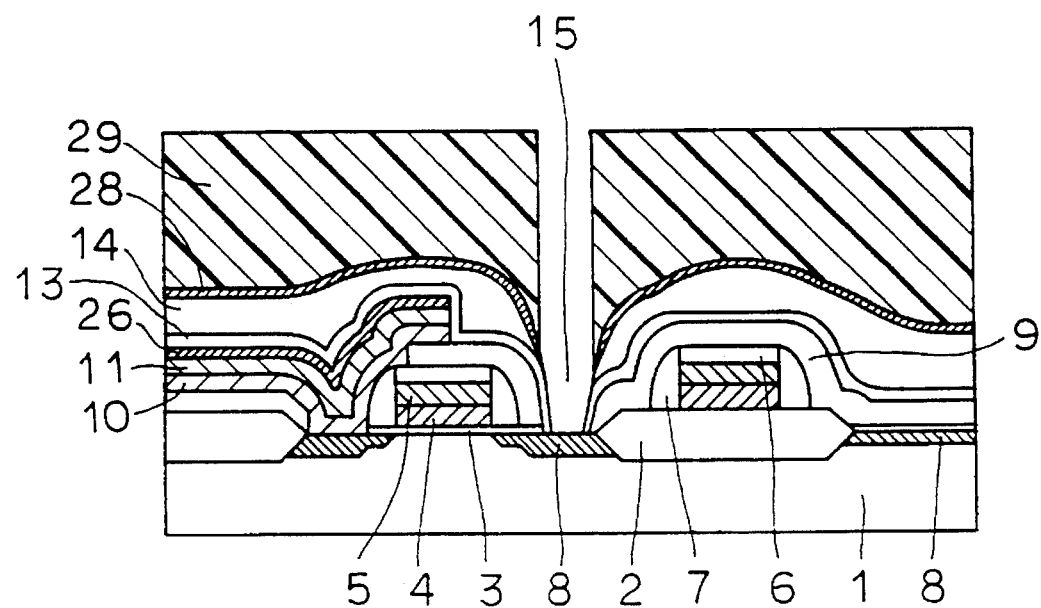

Referring to FIG. 18, using resist film 29 as a mask, plasma silicon nitride film 28, BPSG film 14, silicon oxide films 9 and 13 and gate oxide film 3 are successively etched by the same apparatus to form a contact hole 15.

Figure 19:
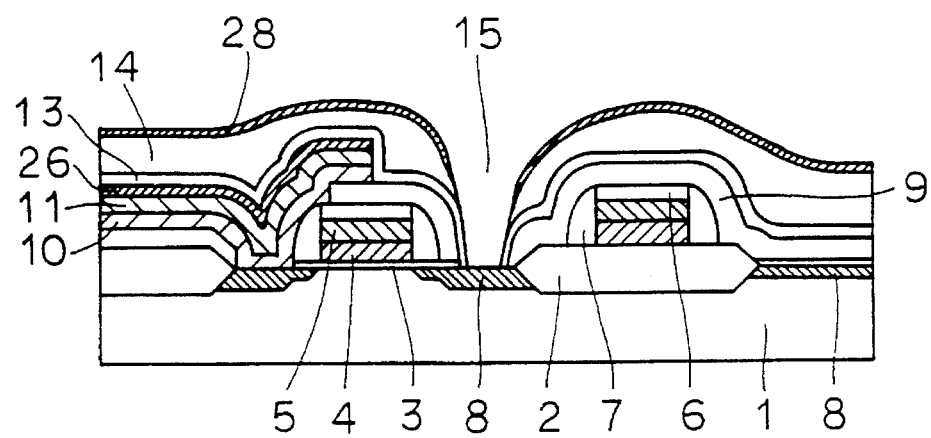
Figure 45:
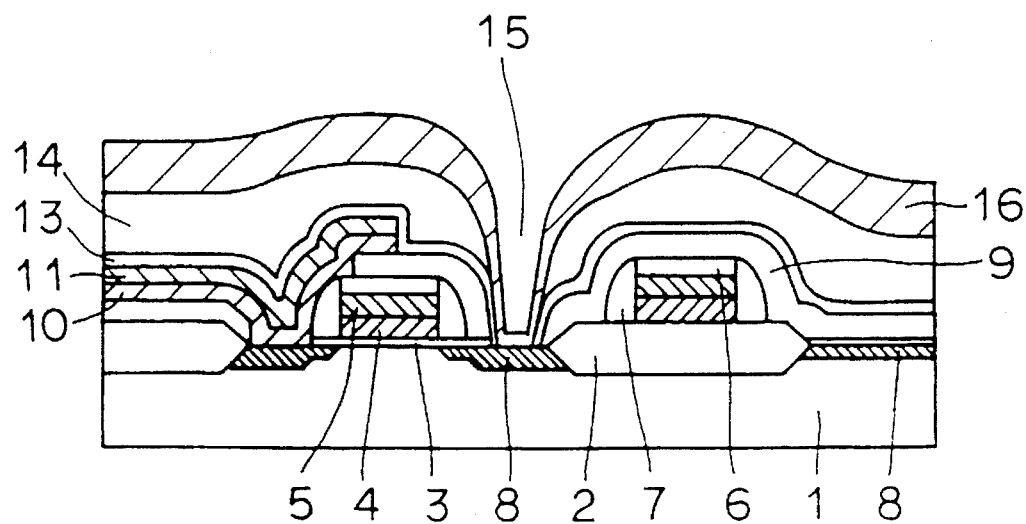
Figure 46:
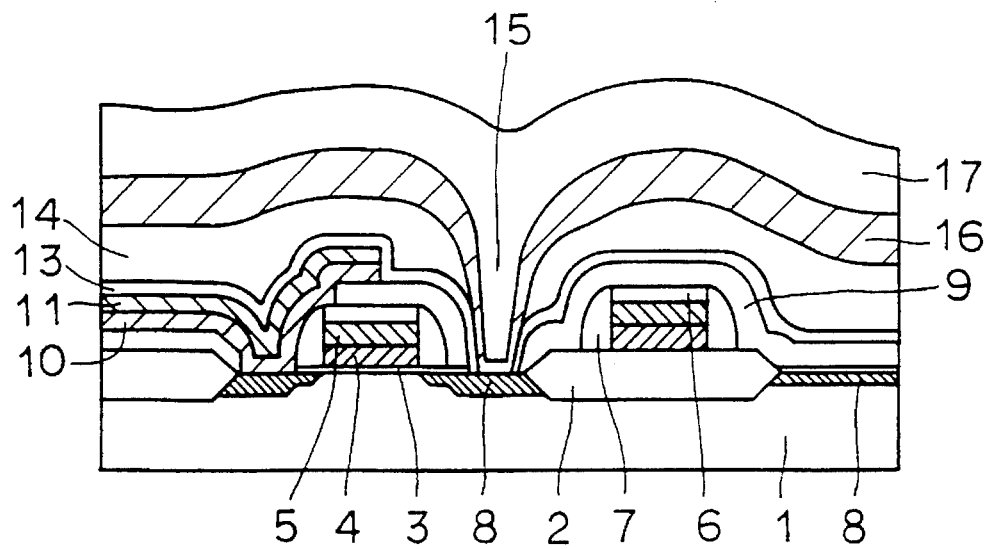
Figure 47:
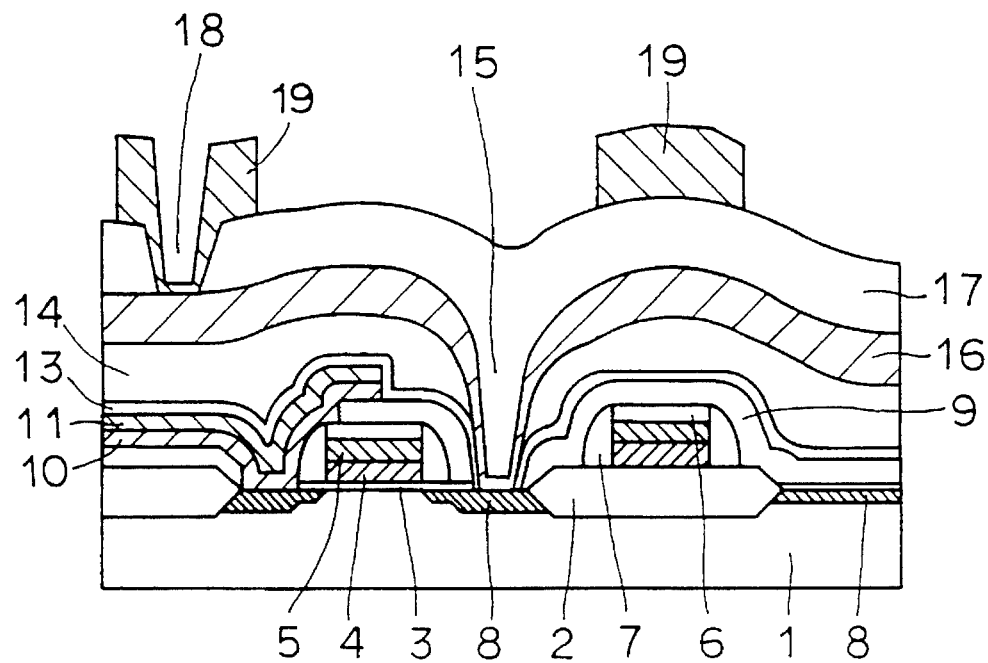
Figure 48:
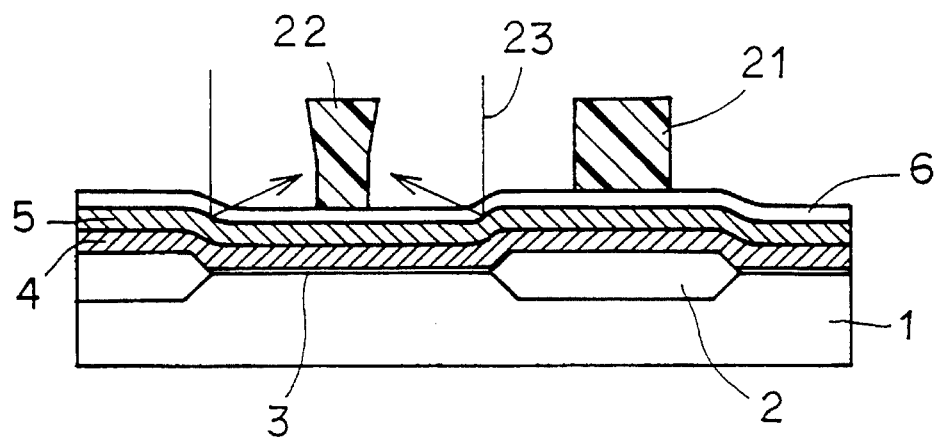
FIG. 48 is a cross sectional view showing the problem in the prior art.
Figure 49:
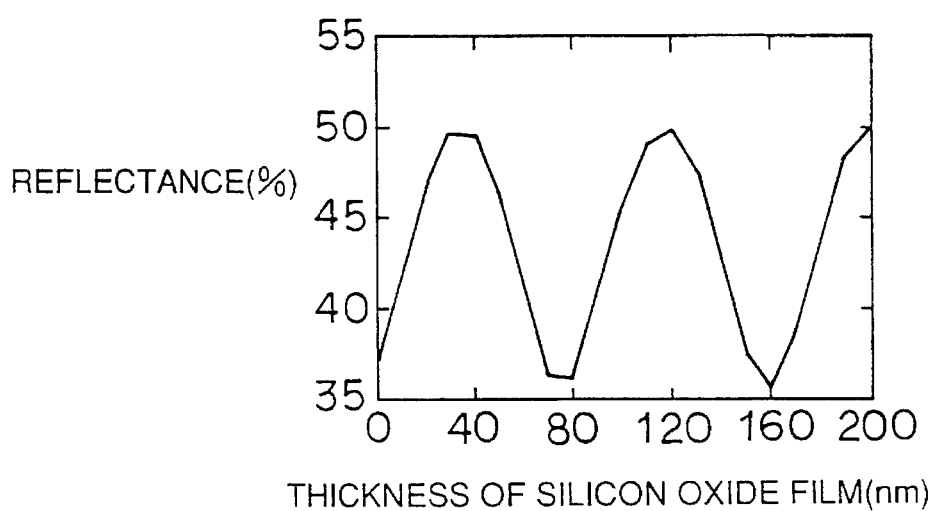
FIG. 49 is a graph showing relation between the reflectance of the exposure light at the surface of the silicon oxide film and the thickness of the silicon oxide film in the prior art.
Figure 50:
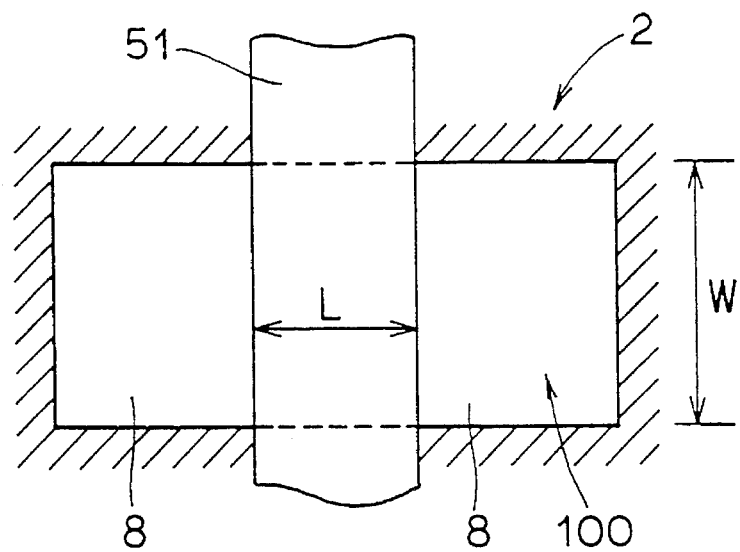
FIG. 50 is a plan view showing relation between each of the active region, the element isolating region and the gate electrode.
Figure 51:
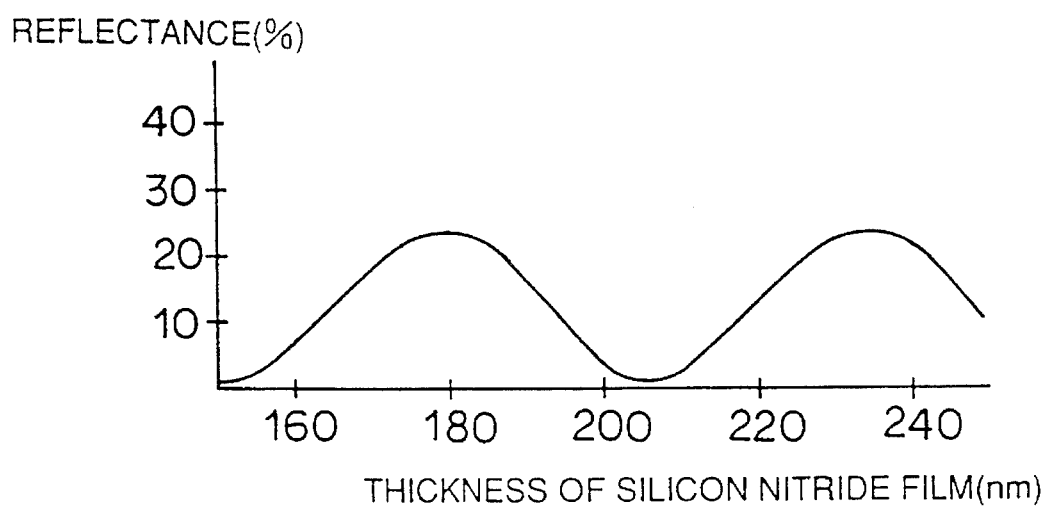
FIG. 51 shows reflectance of the exposure light at the interface between the silicon nitride film and the resist film with respect to the change in thickness of the silicon nitride film of the prior art.
Figure 52:
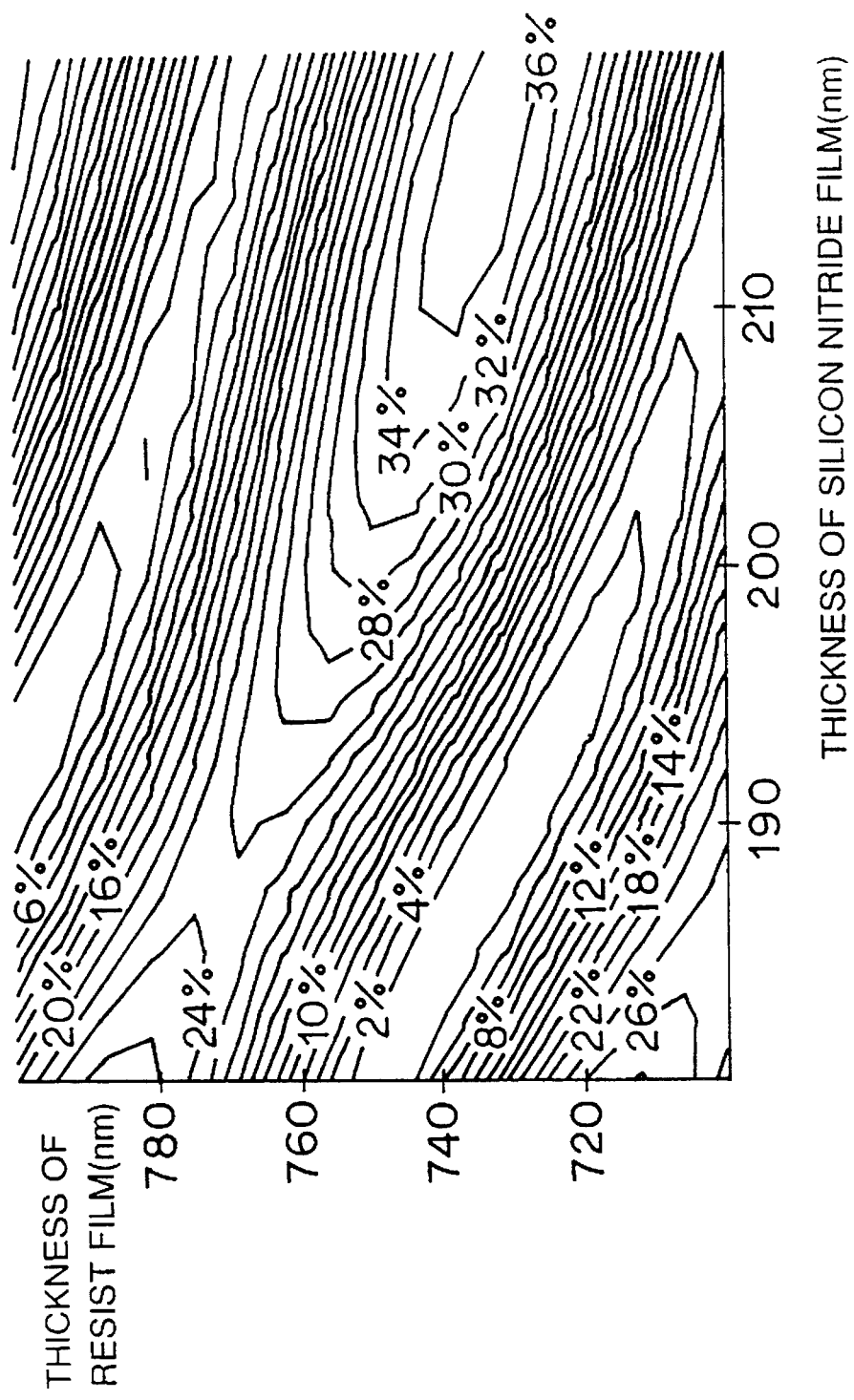
FIG. 52 shows reflectance of the exposure light at the interface between the silicon nitride film and the resist film with respect to the change in thickness of the silicon nitride film and the resist film in the prior art.

Referring to FIG. 19, after removal of resist film 29, the semiconductor device shown in FIG. 1 is completed by the same process as that of the conventional one shown in FIGS. 45–47. Although the thickness of the plasma silicon nitride film is assumed to be 20 nm in the above embodiment, it is not limited thereto and may be 60 nm or more.

Figure 20:
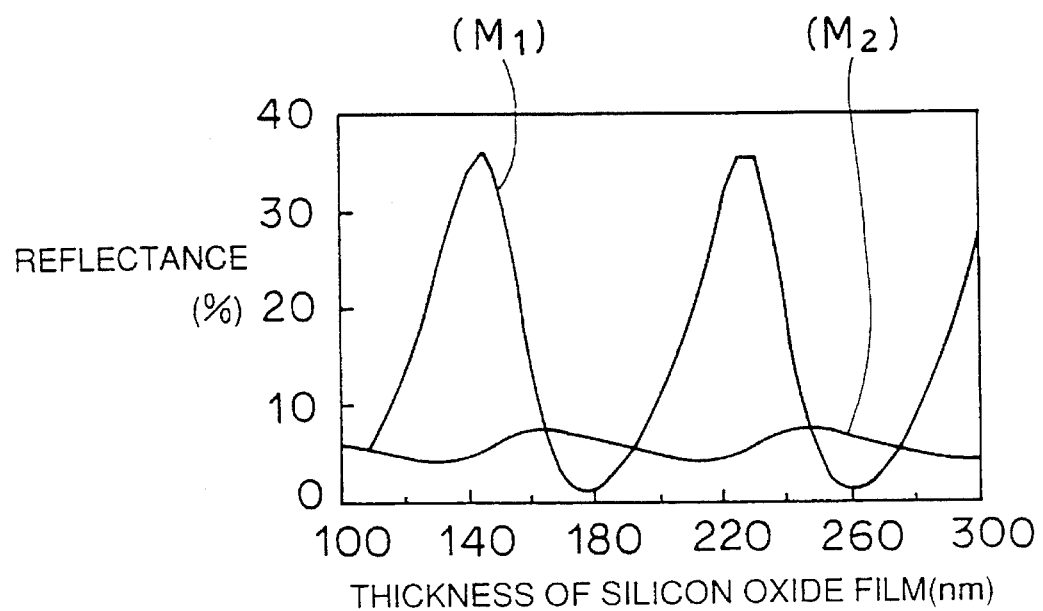
FIG. 20 is a graph showing relation between the reflectance of the exposure light at the interface between the resist film and the plasma silicon nitride film and the thickness of the silicon oxide film.

Referring to FIG. 20, consider two plasma silicon nitride films 25 having the thickness of 20 nm ($M_1$) and 60 nm ($M_2$), respectively FIG. 20 shows the relation between the reflectance at the interface between resist film 21 and plasma silicon nitride film 25 and the thickness of silicon oxide film 6.

As is obvious from this figure, by making thicker the plasma silicon nitride film 25 as an anti-reflection film, the variation of the reflectance of silicon oxide film 6 with respect to the variation of thickness of silicon oxide film 6 can be made smaller.

Therefore, when it is not easy to control the thickness of silicon oxide film 6 for example, a constant reflectance can be obtained as shown in FIG. 20 by setting the thickness of plasma silicon nitride film 25 to 60 nm or more.

Figure 21:
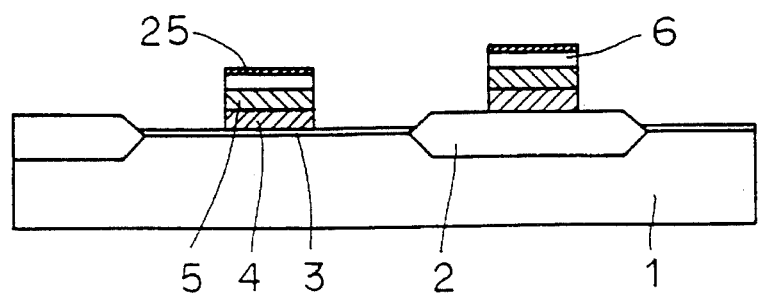
FIG. 21 is a cross sectional view showing the state where the silicon nitride film is left.
Figure 22:
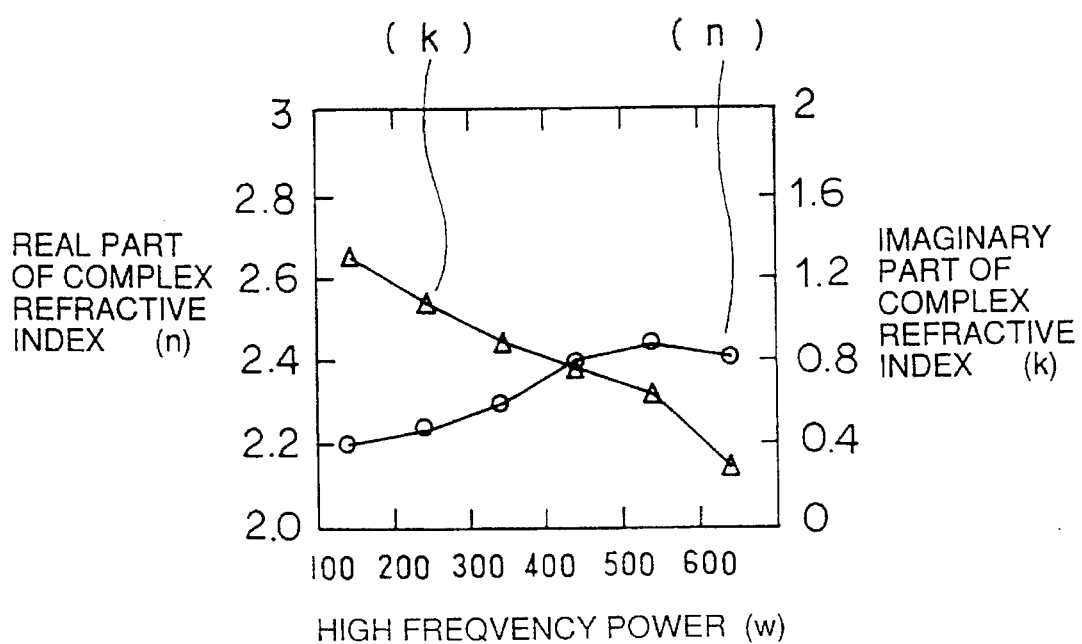
FIG. 22 is a graph showing the relation between the high frequency power applied to the plasma enhanced vapor deposition apparatus in forming a silicon nitride film and the complex refractive index of the silicon nitride film.

In this case however, plasma silicon nitride film 25 cannot be removed completely, and plasma silicon nitride film 25 is left on silicon oxide film 6 as shown in FIG. 21, in the step as shown in FIG. 11(a) and (b) for example.

In this case, the etching rate at which plasma silicon nitride film 25 is removed is about 20 nm/min. even though phosphoric acid heated to 150° C. or more is used as an etchant.

Meanwhile, with respect to the silicon oxide film and the refractory metal silicide, the selectivity of more than 20 is obtained under the same condition. Therefore, plasma silicon nitride film 25 can be completely removed by treating it with phosphoric acid for at most 3 minutes under the same condition described above.

Note that the reduction in thickness of silicon oxide film 6 and refractory metal silicide film can be negligible at this time.

As described above, in accordance with the first embodiment, at the time of forming the field oxide film, a plasma silicon nitride film having much silicon than the stoichiometric silicon nitride ($Si_3N_4$) is used as an anti reflection film having a prescribed value of complex refractive index. Accordingly, variation of energy of the exposure light for the resist film and variation of the energy of the exposure light for the resist film caused by variation in thickness of the resist can be suppressed.

As a result, the resist film can be patterned to a prescribed shape, which enables highly precise processing of the resist film, and hence the plasma silicon nitride film can be precisely patterned by using the resist film.

In addition, the plasma silicon nitride film is used as the anti-reflection film, and the plasma silicon nitride film and the conductive layer are patterned simultaneously. This enables continuous patterning by the same apparatus. When the silicon nitride film is to be removed, it is possible to effectively remove the silicon nitride film simultaneously with the patterning of the conductive layer, without providing any additional step for removing the silicon nitride film.

A second embodiment of the present invention will be described with reference to the figures.

It has been generally known that a silicon nitride film of the stoichiometric silicon nitride ($Si_3N_4$) is very hard, and gradually becomes less hard as the content of silicon component in the silicon nitride film increases. The plasma silicon nitride film used in the first embodiment includes more silicon than the silicon nitride film. Therefore, there may arise the problem of strength of the plasma silicon nitride film during the formation of the field oxide film.

Figure 4:
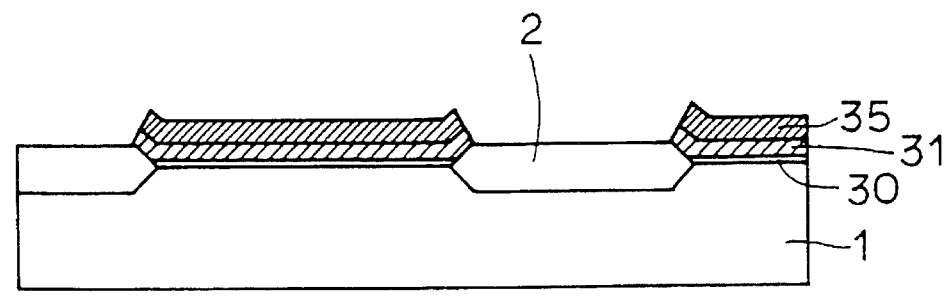

More specifically, in the step shown in FIG. 4 of the first embodiment, plasma silicon nitride film 35 is pressed upward at both ends of field oxide film 2. At this time, if plasma silicon nitride film 35 is not strong enough, the plasma silicon nitride film may be separated, or the extension of the bird's beaks of the field oxide film 2 may not be suppressed. As a result, field oxide film 2 may possibly be formed undesirably large.

As a method to cope with such a problem, a plasma silicon nitride film 35 including more silicon than the stoichiometric silicon nitride ($Si_3N_4$) described in the first embodiment may be provided on the conventional silicon nitride film 32 of stoichiometric silicon nitride ($Si_3N_4$).

Figure 25:
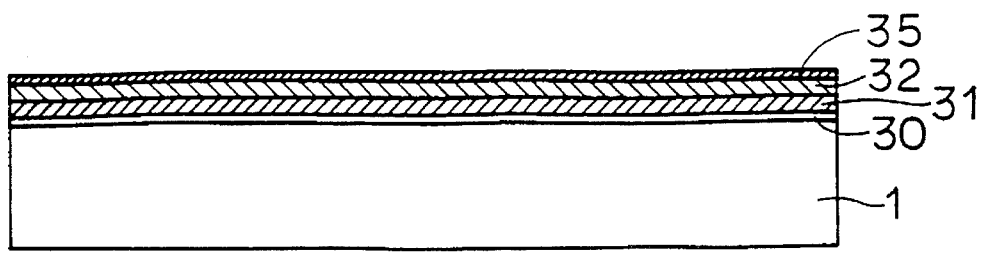
FIGS. 25 to 27 are cross sections showing the first to third steps of manufacturing in accordance with the second embodiment of the present invention.
Figure 32:
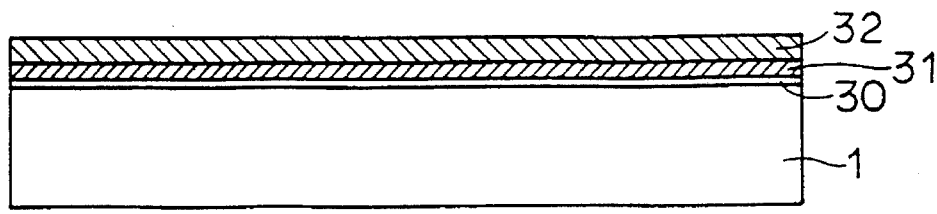
FIGS. 32 through 47 are cross sectional views showing the first to thirteenth manufacturing steps based on the conventional method of manufacturing a semiconductor device.
Figure 33:
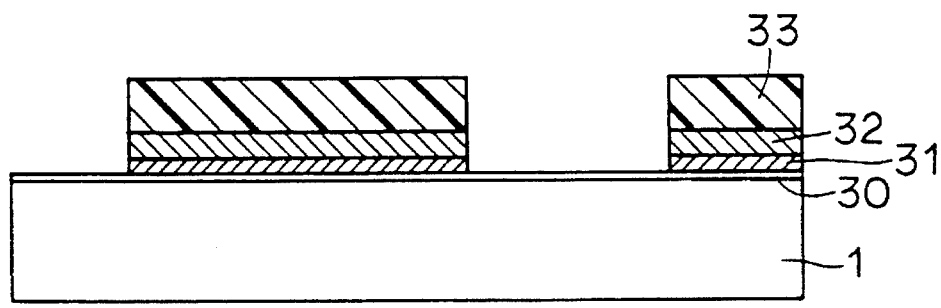
Figure 34:
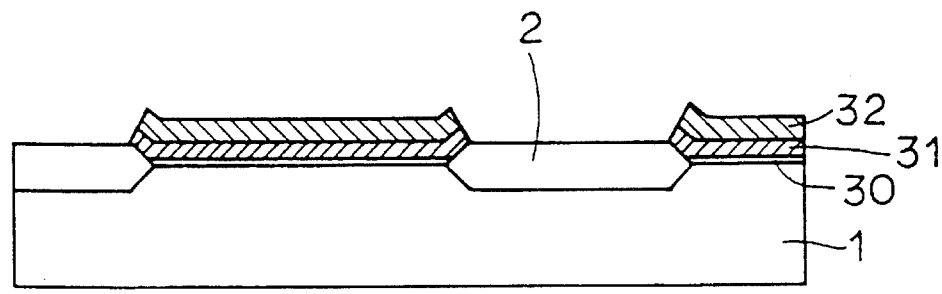
Figure 35:
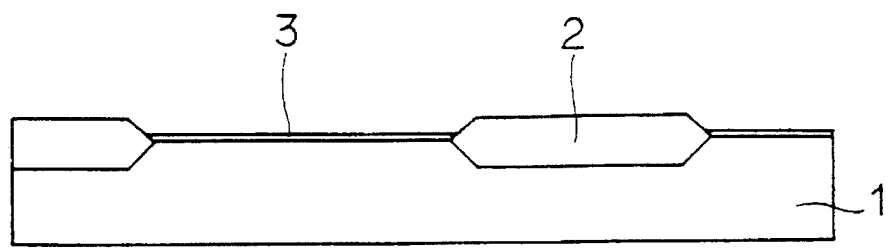
Figure 36:
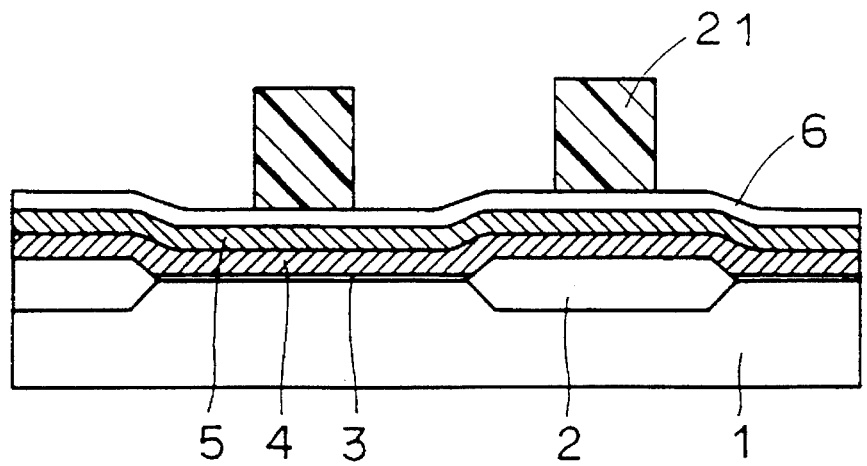
Figure 37:
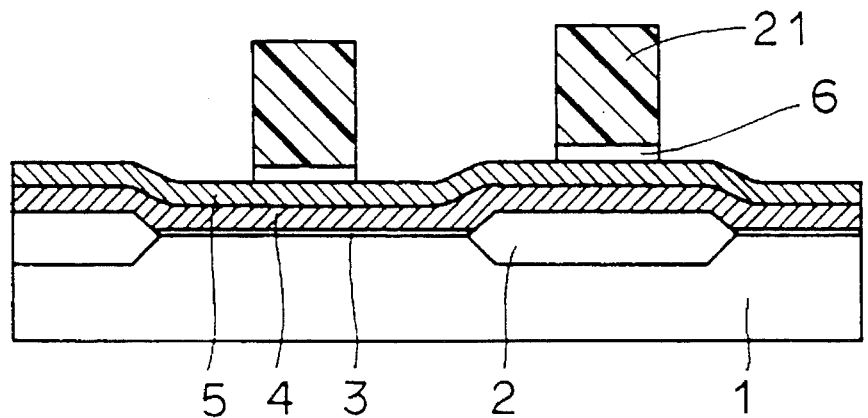
Figure 38:
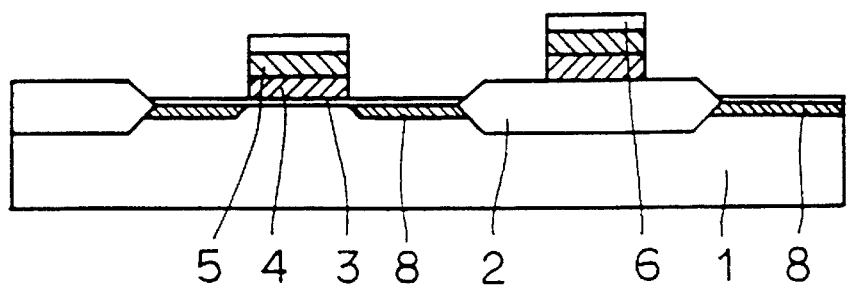
Figure 39:
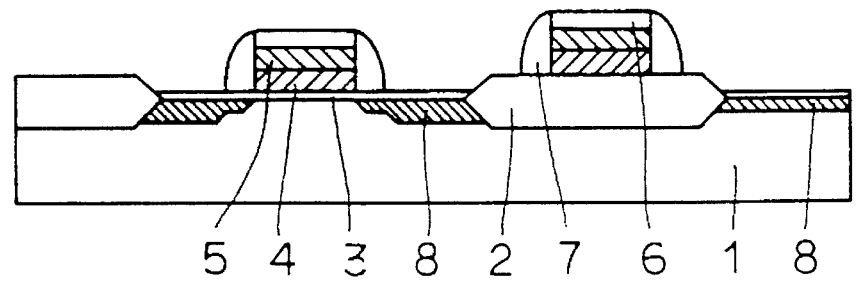
Figure 40:
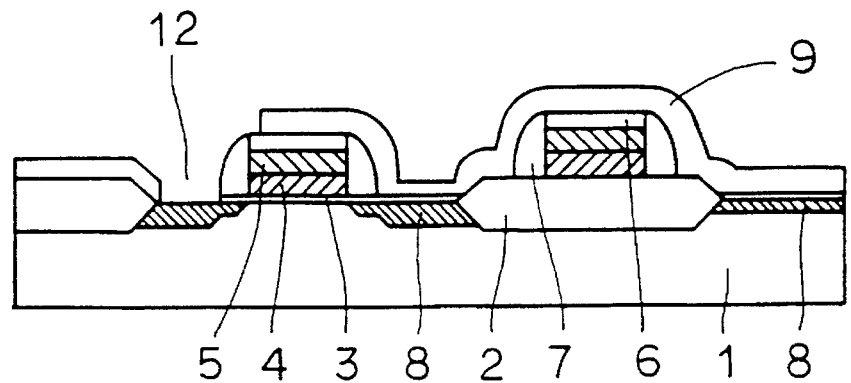
Figure 41:
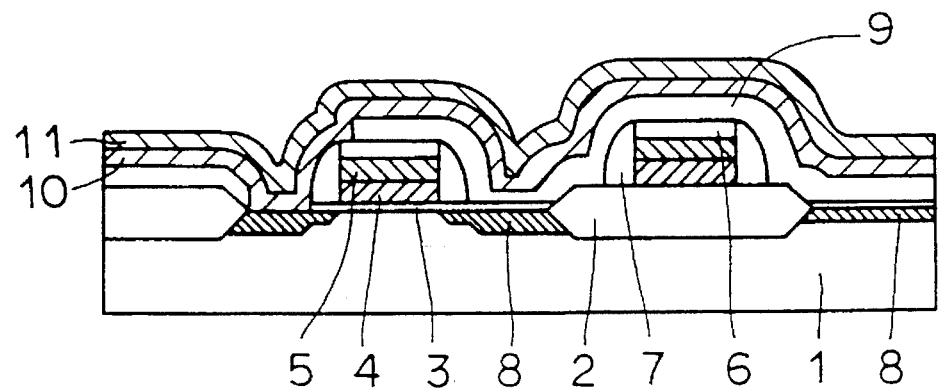
Figure 42:
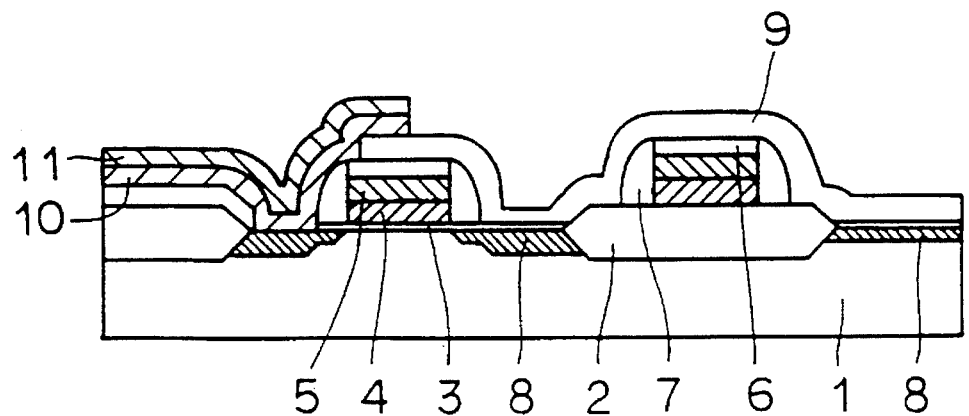
Figure 43:
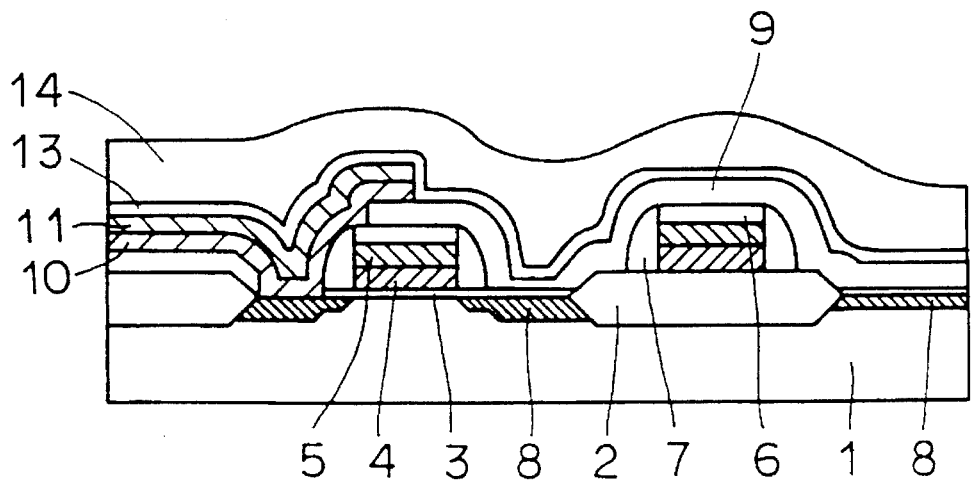
Figure 44:
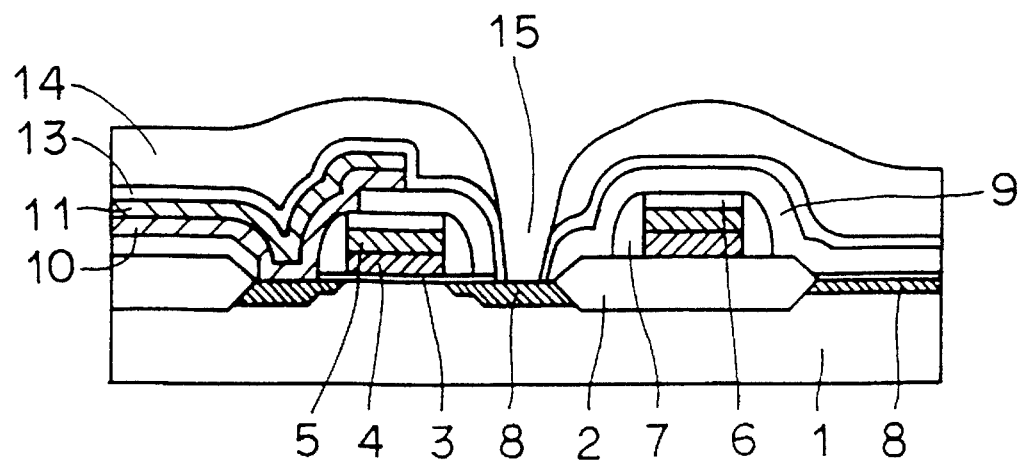

Referring to FIG. 25, in the similar manner as in the step shown in FIG. 32 of the prior art, an oxide film 30, a polysilicon layer 31 and a silicon nitride film 32 are formed on semiconductor substrate 1. Thereafter, on silicon nitride film 32, a plasma silicon nitride film 35 having the thickness of 10 nm to 800 nm is formed in the similar manner as in the first embodiment. At this time, as compared with the first embodiment, since silicon nitride film 32 is formed, the plasma silicon nitride film can be formed relatively thin.

Figure 26:
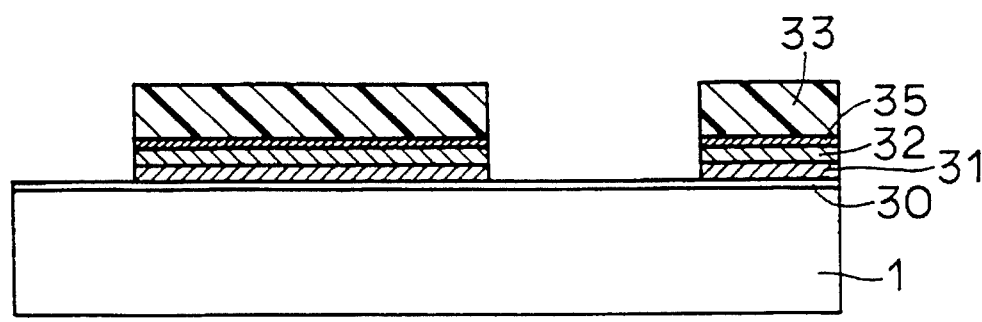
Figure 27:
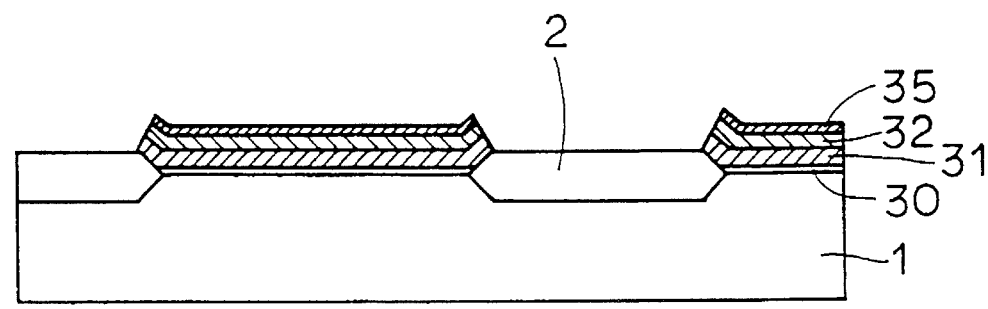
Figure 28:
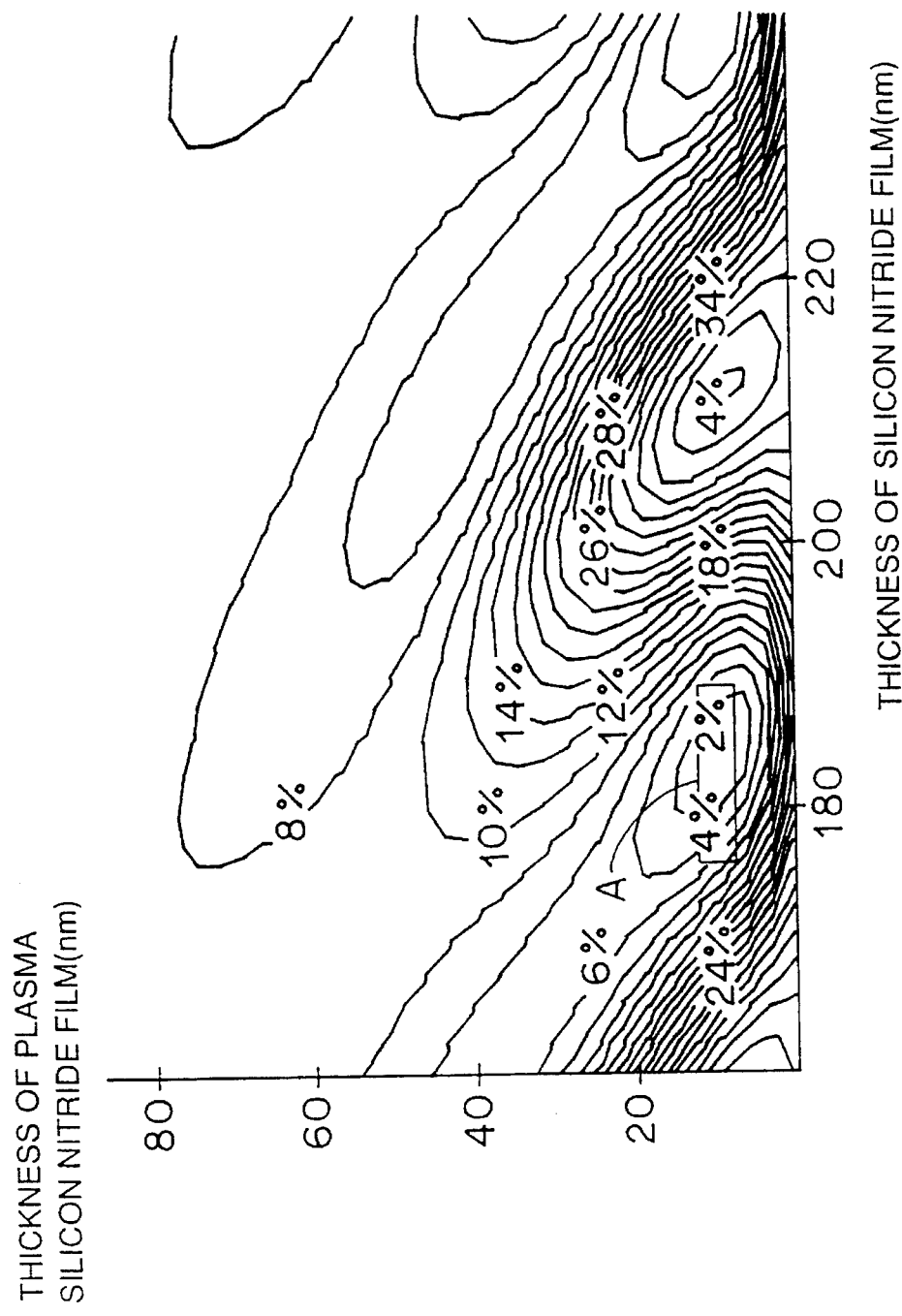
FIG. 28 shows reflectance of the exposure light at the interface between the plasma silicon nitride film and the resist film with respect to the change in thicknesses of the silicon nitride film and the plasma silicon nitride film in accordance with the second embodiment of the present invention.

Then, referring to FIG. 26, a resist film 33 of 700 nm 800 nm having a prescribed pattern is formed on plasma silicon nitride film 35, and plasma silicon nitride film 35, silicon nitride film 32 and polysilicon layer 31 are patterned using resist film 33 as a mask. Thereafter, referring to FIG. 27, resist film 33 is removed and field oxide film 2 is formed in the similar manner as in the first embodiment. FIG. 28 shows reflectance at the interface between resist film 33 and plasma silicon nitride film 35 with the thicknesses of silicon nitride film 32 and plasma silicon nitride film 35 changed. The wavelength of the exposure light at this time is 248 nm. If the thickness of plasma silicon nitride film 35 is in the range of from 10 nm to 400 nm, reflectance varies widely as the thickness of silicon nitride film 32 varies. However, if the thickness of the plasma silicon nitride film 35 exceeds 50 nm, variation of reflectance becomes smaller and the reflectance itself becomes lower. This means that the variation in reflectance is small when the resist film varies in thickness. Accordingly, the preferred thickness of the plasma silicon nitride film is about 50 nm.

Figure 29:
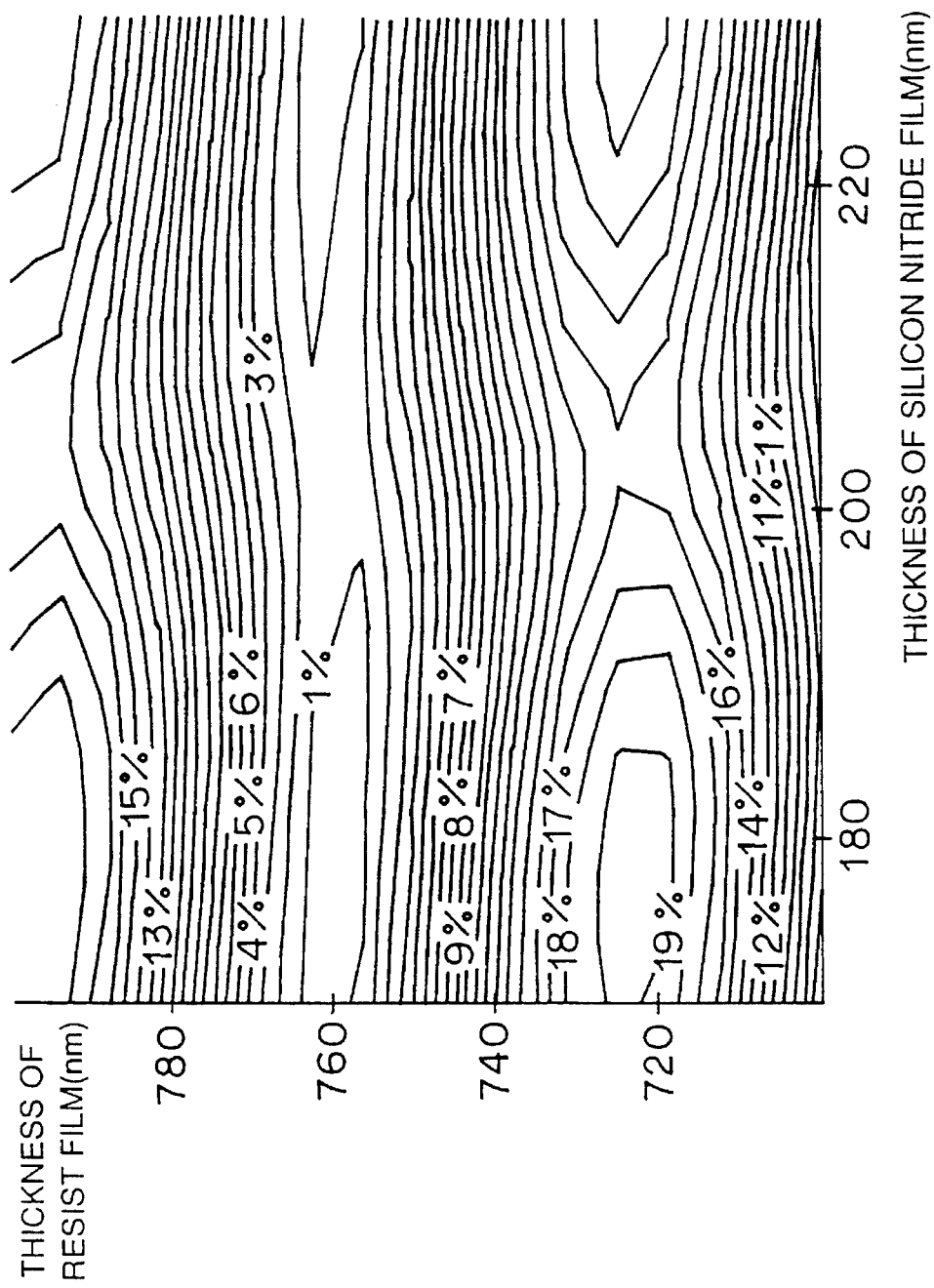
FIG. 29 shows reflectance of the exposure light at the interface between the plasma silicon nitride film and the resist film with respect to the change in thicknesses of the plasma silicon nitride film and the resist film in accordance with the second embodiment.

FIG. 29 shows reflectance at the interface between resist film 33 and plasma silicon nitride film 35 when the thicknesses of silicon nitride film 32 and resist film are changed, while the thickness of the silicon nitride film is fixed at 50 nm. The wavelength of exposure light at this time is 248 nm. The reflectance hardly changes with respect to the variation of the thickness of the nitride film, but varies relative to the variation of the thickness of the resist film. The reflectance varies from 0% to 19%, and as in the first embodiment, the resist film can be patterned precisely to a desired shape.

Figure 30:
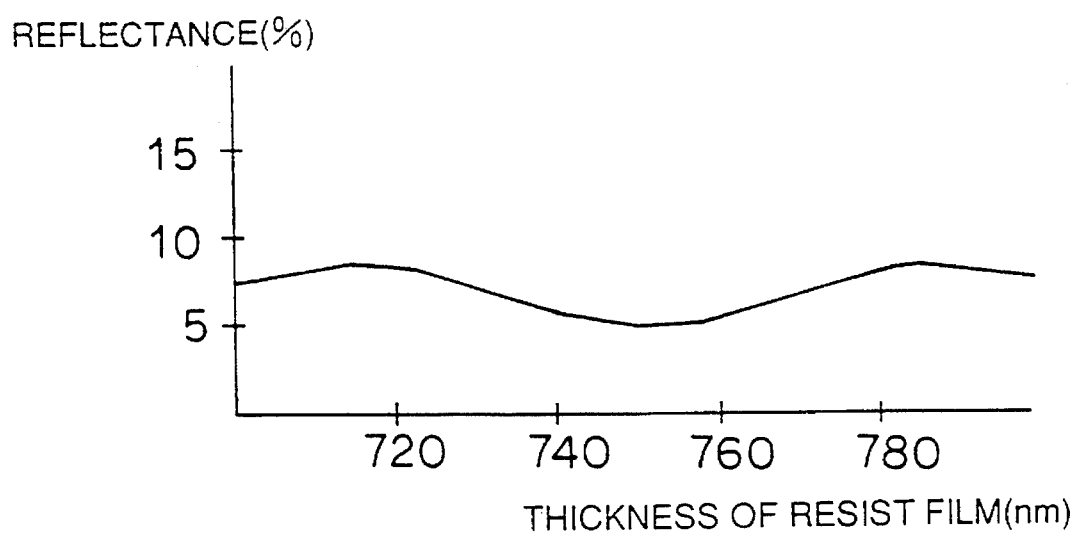
FIG. 30 shows reflectance of the exposure light at the interface between the plasma silicon nitride film and the resist film with respect to the change in thickness of the resist film in accordance with the second embodiment of the present invention.

Referring to the region denoted by A in FIG. 28, it can be understood that a region with a very low reflectance can be obtained locally by controlling the thickness of the silicon nitride film in the range of 176 nm to 189 nm and the thickness of the plasma silicon nitride film in the range of from 7.5 nm to 11 nm. FIG. 30 is a graph showing the reflectance at the interface between the resist film and plasma silicon nitride film of the exposure light when the thickness of the silicon nitride film is 182.5 nm and the thickness of the plasma silicon nitride film is 9.2 nm at the center of the region A. The change of reflectance in this example is in the range of 5% to 8%, which variation is very small. Therefore, by the combination of the silicon nitride film and the plasma silicon nitride film having the above mentioned thicknesses, a very low reflectance of the exposure light is obtained at the interface between the resist film and the plasma silicon nitride film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate on a main surface of which an element isolating region and an active region are formed;

a MOS field effect transistor formed on said active region and having a pair of impurity diffused layers;

a conductive layer electrically connected to one of said pair of impurity diffused layers;

a first anti-reflection film formed of plasma silicon nitride film including more silicon than a stoichiometrical silicon nitride ($Si_3N_4$) formed on said conductive layer;

an interlayer insulating film having a contact hole reaching the other one of said pair of impurity diffused layers and covering said first anti-reflection film and said MOS field effect transistor;

a second anti-reflection film formed of a plasma silicon nitride film including more silicon than the stoichiometrical silicon nitride ($Si_3N_4$) formed on said interlayer insulating film; and an interconnection layer electrically connected to the other one of said pair of impurity diffused layers formed on said second anti-reflection film.

2. The semiconductor device according to claim 1, further comprising a third anti-reflection film formed of $Si_3N_4$ under the first anti-reflection film.

3. The semiconductor device according to claim 2, further comprising a fourth anti-reflection film formed of $Si_3N_4$ under the second anti-reflection film.

4. The semiconductor device according to claim 1, wherein the first and second anti-reflection films are formed of a plasma silicon nitride film $Si_xN_y$, wherein $0.75 < x/y < 1.4$.

5. The semiconductor device according to claim 1, wherein the reflectance of the first and second anti-reflection films is 30% or less upon exposure.

6. The semiconductor device according to claim 1, wherein the ratio $(T_1/T_2)$ and the ratio $(V_1/V_2)$ is:

$$T_1/T_2 \leq V_1/V_2,$$

wherein $T_1$ is the thickness of the first anti-reflection film, $T_2$ is the thickness of the conductive layer, $V_1$ is an etching rate of the first anti-reflection film and $V_2$ is an etching rate of the conductive layer.

* * * * *

UNITED STATES PATENT AND TRADEMARK OFFICE
CERTIFICATE OF CORRECTION

PATENT NO. : 5,488,246
DATED : January 30, 1996
INVENTOR(S) : Yoshio HAYASHIDE et al.

It is certified that error appears in the above-indentified patent and that said Letters Patent is hereby corrected as shown below:

On the title page, delete item [62] in its entirety.

Signed and Sealed this

Seventeenth Day of September, 1996

Attest:

BRUCE LEHMAN

*Attesting Officer*   *Commissioner of Patents and Trademarks*